(12) United States Patent
Shimizu et al.

(10) Patent No.: US 9,093,362 B2
(45) Date of Patent: Jul. 28, 2015

(54) SEMICONDUCTOR DEVICE AND METHOD OF MANUFACTURING THE SAME

(71) Applicant: Kabushiki Kaisha Toshiba, Minato-ku (JP)

(72) Inventors: Tatsuo Shimizu, Tokyo (JP); Johji Nishio, Tokyo (JP); Chiharu Ota, Kanagawa (JP); Takashi Shinohe, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/205,887

(22) Filed: Mar. 12, 2014

(65) Prior Publication Data

US 2014/0284621 A1   Sep. 25, 2014

(30) Foreign Application Priority Data

Mar. 22, 2013   (JP) ................................. 2013-059829

(51) Int. Cl.

| H01L 31/0312 | (2006.01) |
|---|---|
| H01L 21/265 | (2006.01) |
| H01L 21/00 | (2006.01) |
| H01L 29/16 | (2006.01) |
| H01L 21/04 | (2006.01) |
| C30B 29/36 | (2006.01) |
| H01L 29/66 | (2006.01) |
| H01L 29/78 | (2006.01) |

(52) U.S. Cl.
CPC ............ *H01L 29/1608* (2013.01); *C30B 29/36* (2013.01); *H01L 21/046* (2013.01); *H01L 21/049* (2013.01); *H01L 21/0465* (2013.01); *H01L 29/66068* (2013.01); *H01L 29/7827* (2013.01)

(58) Field of Classification Search
CPC ................... H01L 21/02378; H01L 21/02447; H01L 29/1608; C30B 29/36
USPC ..................................... 257/77; 438/105, 521
See application file for complete search history.

(56) References Cited

U.S. PATENT DOCUMENTS

| 2004/0212011 A1* | 10/2004 | Ryu ............................... 257/335 |
| 2010/0289033 A1 | 11/2010 | Ohtani et al. |
| 2011/0001209 A1* | 1/2011 | Watanabe et al. ............. 257/484 |
| 2012/0025153 A1 | 2/2012 | Hirose et al. |

FOREIGN PATENT DOCUMENTS

| JP | 2009-167047 | 7/2009 |
| JP | 2011-233919 | 11/2011 |
| JP | 2012-31014 | 2/2012 |

* cited by examiner

*Primary Examiner* — David S Blum
(74) *Attorney, Agent, or Firm* — Oblon, McClelland, Maier & Neustadt, L.L.P.

(57) ABSTRACT

A semiconductor device of an embodiment includes an n-type SiC impurity region containing a p-type impurity and an n-type impurity. Where the p-type impurity is an element A and the n-type impurity is an element D, the element A and the element D form a combination of Al (aluminum), Ga (gallium), or In (indium) and N (nitrogen), and/or a combination of B (boron) and P (phosphorus). The ratio of the concentration of the element A to the concentration of the element D in the above combination is higher than 0.40 but lower than 0.95, and the concentration of the element D forming the above combination is not lower than $1\times10^{18}$ cm$^{-3}$ and not higher than $1\times10^{22}$ cm$^{-3}$.

15 Claims, 24 Drawing Sheets

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2013-059829, filed on Mar. 22, 2013, the entire contents of which are incorporated herein by reference.

FIELD

Embodiments described herein relate generally to a semiconductor device and a method of manufacturing the same

BACKGROUND

SiC (silicon carbide) is expected to be a material for next-generation power semiconductor devices. SiC has excellent physical properties, having a band gap three times wider than that of Si (silicon), a breakdown field strength approximately 10 times higher than that of Si, and a heat conductivity approximately three times higher than that of Si. A power semiconductor device that has low loss and is capable of high-temperature operation can be realized by taking advantage of those properties.

Meanwhile, it is difficult to lower the resistance in a p-type impurity region or an n-type impurity region with SiC, because the solid solubility limit of an impurity is too low, and levels formed with the impurity in the band gap are too deep.

DETAILED DESCRIPTION

Figure 1:
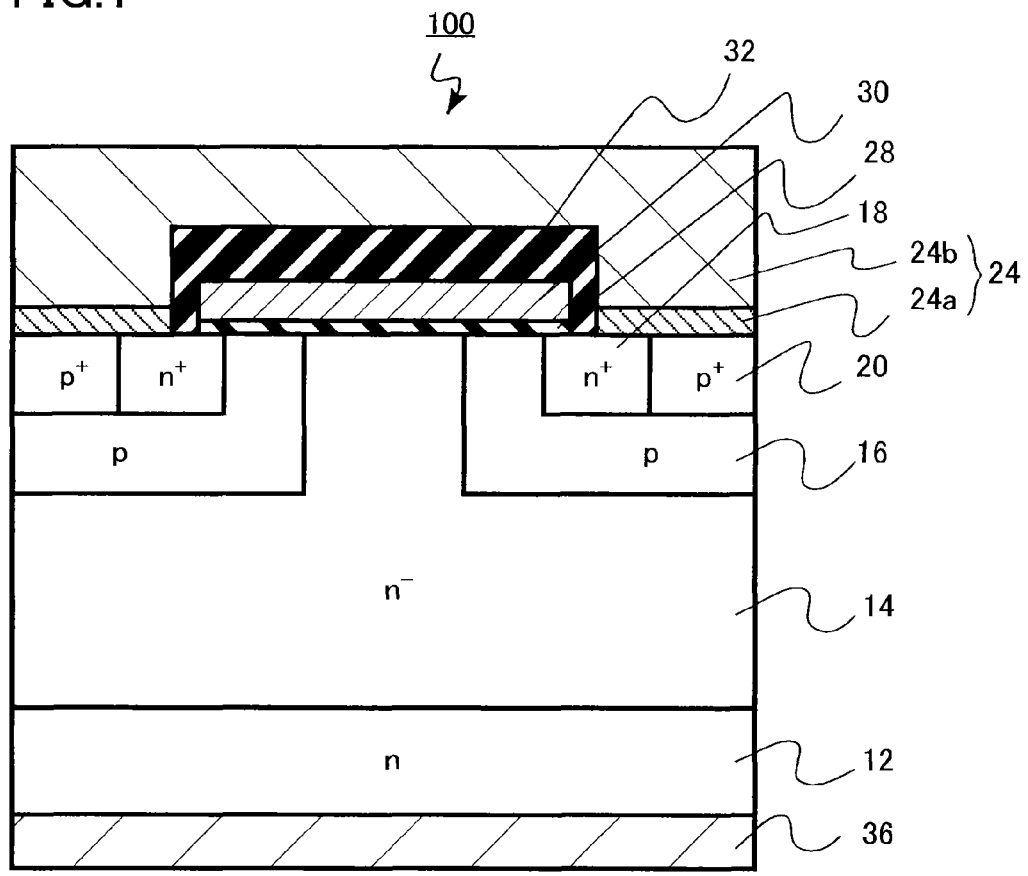
FIG. 1 is a schematic cross-sectional view of a semiconductor device of a first embodiment.

A semiconductor device of an embodiment includes an n-type SiC impurity region containing a p-type impurity and an n-type impurity. Where the p-type impurity is an element A and the n-type impurity is an element D, the element A and the element D form at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus). The ratio of the concentration of the element A to the concentration of the element D in the above combination is higher than 0.40 but lower than 0.95, and the concentration of the element D forming part of the above combination is not lower than $1\times10^{18}$ cm$^{-3}$ and not higher than $1\times10^{22}$ cm$^{-3}$.

The following is a description of embodiments, with reference to the accompanying drawings. In the following description, like components are denoted by like reference numerals, and explanation of components described once will not be repeated.

In the following description, $n^+$, n, $n^-$, $p^+$, p, and $p^-$ indicate relative levels of impurity densities in the respective conductivity types. Specifically, $n^+$ indicates that an n-type impurity concentration is relatively higher than that of n, and $n^-$ indicates that an n-type impurity concentration is relatively lower than that of n. Likewise, $p^+$ indicates that a p-type impurity concentration is relatively higher than that of p, and $p^-$ indicates that a p-type impurity concentration is relatively lower than that of p. It should be noted that there are cases where an $n^+$ type and an $n^-$ type are referred to simply as an n-type, and a $p^+$ type and a $p^-$ type are referred to simply as a p-type.

First Embodiment

A semiconductor device of this embodiment includes an SiC substrate having first and second faces, an n-type SiC layer formed on the side of the first face of the SiC substrate, and a p-type first SiC region formed in the surface of the SiC layer. The semiconductor device also includes an n-type second SiC region that is formed in the surface of the first SiC region, and contains a p-type impurity and an n-type impurity. Where the p-type impurity is an element A and the n-type impurity is an element D, the element A and the element D form a combination of Al (aluminum), Ga (gallium), or In (indium) and N (nitrogen), and/or a combination of B (boron) and P (phosphorus). In other words, the element A and the element D form at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus). The ratio of the concentration of the element A to the concentration of the element D in the above combination is higher than 0.40 but lower than 0.95, and the concentration of the element D forming part of the above combination is not lower than $1\times10^{18}$ cm$^{-3}$ and not higher than $1\times10^{22}$ cm$^{-3}$. The semiconductor device further includes a gate insulating film continuously formed on the surfaces of the SiC layer and the first SiC region, a gate electrode formed on the gate insulating film, a first electrode formed on the second SiC region, and a second electrode formed on the side of the second face of the SiC substrate.

FIG. 1 is a schematic cross-sectional view of the structure of a MOSFET that is a semiconductor device of this embodiment. This MOSFET (Metal Oxide Semiconductor Field Effect Transistor) 100 is a Double Implantation MOSFET (DIMOSFET) having a p-well and a source region formed through ion implantation, for example.

This MOSFET 100 includes an SiC substrate (a silicon carbide substrate) 12 having first and second faces. In FIG. 1, the first face is the upper face, and the second face is the lower face. This SiC substrate 12 is an n-type 4H—SiC substrate (an n-substrate) that contains N (nitrogen) as the n-type impurity at an impurity concentration of approximately $1\times10^{18}$ to $1\times10^{19}$ cm$^{-3}$, for example.

An n-type SiC layer (an n$^-$-SiC layer) 14 containing the n-type impurity at an impurity concentration of approximately $5\times10^{15}$ to $2\times10^{16}$ cm$^{-3}$, for example, is formed on the first face of the SiC substrate 12. The film thickness of the n$^-$-SiC layer 14 is approximately 5 to 10 μm, for example.

A p-type first SiC region (a p-well region) 16 containing the p-type impurity at an impurity concentration of approximately $5\times10^{15}$ to $1\times10^{17}$ cm$^{-3}$ is formed in part of the surface of the n$^-$-SiC layer 14. The depth of the p-well region 16 is approximately 0.6 μm, for example. The p-well region 16 functions as the channel region of the MOSFET 100.

An n$^+$-type second SiC region (a source region) 18 containing the n-type impurity at an impurity concentration of approximately $1\times10^{18}$ cm$^{-3}$ to $1\times10^{22}$ cm$^{-3}$, for example, is formed in part of the surface of the first SiC region (the p-well region) 16. The depth of the source region 18 is smaller than the depth of the first SiC region (the p-well region) 16, and is approximately 0.3 μm, for example.

The n$^+$-type second SiC region (the source region) 18 is co-doped with the p-type impurity and the n-type impurity. Where the p-type impurity is the element A and the n-type impurity is the element D, the element A and the element D form a combination of Al (aluminum), Ga (gallium), or In (indium) and N (nitrogen), and/or a combination of B (boron) and P (phosphorus). Further, the ratio of the concentration of the element A to the concentration of the element D in the above combination is higher than 0.40 but lower than 0.95.

The concentration of the element D forming part of the above combination is not lower than $1\times10^{18}$ cm$^{-3}$ and not higher than $1\times10^{22}$ cm$^{-3}$.

In the case of the first combination of Al (aluminum), Ga (gallium), or In (indium) and N (nitrogen), for example, the element A may be a single element selected from Al (aluminum), Ga (gallium), and In (indium). Alternatively, the element A may be formed with two elements such as Al (an element $A_1$) and Ga (an element $A_2$) or may be formed with three elements such as Al (the element $A_1$), Ga (the element $A_2$), and In (an element $A_3$). In a case where the element A is formed with more than one element, the element A may be formed with two or three kinds of elements, as long as the above described conditions on the ratio of the concentration of the element A to the concentration of the element D and on the concentration of the element D are satisfied.

The first combination and the second combination can coexist. However, the above described conditions on the ratio of the concentration of the element A to the concentration of the element D and on the concentration of the element D should be satisfied with elements that form at least one of the first and second combinations. In other words, each of the first combination and the second combination should satisfy the conditions on the element ratio and the element concentration. This is because the later described trimer is not formed between an impurity having the first combination and an impurity having the second combination.

In a case where the Al concentration is $1\times10^{18}$ cm$^{-3}$, the Ga concentration is $1\times10^{18}$ cm$^{-3}$, and the N concentration is $4\times10^{18}$ cm$^{-3}$, for example, (Al+Ga)/N is 0.5, and N is $4\times10^{18}$ cm$^{-3}$. In this case, the element ratio and the element densities are within the ranges set by this embodiment.

In a case where the B concentration is $1\times10^{18}$ cm$^{-3}$, the P concentration is $1\times10^{18}$ cm$^{-3}$, and the N concentration is $1\times10^{18}$ cm$^{-3}$, for example, attention is paid only to B and P, which forms the second combination. As a result, B/P is 1.0, which does not satisfy the element ratio condition, and is outside the range set by this embodiment.

Also, in a case where the Al concentration is $2.5\times10^{17}$ cm$^{-3}$, the B concentration is $2.5\times10^{17}$ cm$^{-3}$, the N concentration is $5\times10^{17}$ cm$^{-3}$, and the P concentration is $5\times10^{17}$ cm$^{-3}$, for example, Al/N is 0.5, which satisfies the ratio condition, but the N concentration is lower than $1\times10^{18}$ cm$^{-3}$ in the first combination. In the second combination, B/P is 0.5, which satisfies the ratio condition, but the P concentration is lower than $1\times10^{18}$ cm$^{-3}$. Therefore, either of the first and second combinations does not satisfy the element ratio condition and the element concentration condition, and is outside the range of the embodiment.

It should be noted that this embodiment does not exclude elements other than the above mentioned elements from the p-type impurity and the n-type impurity. In the following, an example case where the element A is Al and the element D is N is described.

A p$^+$-type third SiC region (a p-well contact region) 20 containing the p-type impurity at an impurity concentration of approximately $1\times10^{18}$ cm$^{-3}$ to $1\times10^{22}$ cm$^{-3}$, for example, is also formed in part of the surface of the first SiC region (the p-well region) 16 and on a side of the n$^+$-type second SiC region (the source region) 18. The depth of the p-well contact region 20 is smaller than the depth of the first SiC region (the p-well region) 16, and is approximately 0.3 μm, for example.

A gate insulating film 28 is continuously formed on the surfaces of the n$^-$-SiC layer 14 and the first SiC region (the p-well region) 16, so as to bridge the space between the layer and the region. The gate insulating film 28 may be an $SiO_2$ film or a high-k insulating film, for example.

A gate electrode 30 is formed on the gate insulating film 28. The gate electrode 30 may be made of polysilicon, for example. An interlayer insulating film 32 formed with an $SiO_2$ film, for example, is formed on the gate electrode 30.

The first SiC region 16 interposed between the second SiC region (the source region) 18 under the gate electrode 30 and the n⁻-SiC layer 14 functions as the channel region of the MOSFET 100.

A conductive first electrode (a source/p-well common electrode) 24 that is electrically connected to the second SiC region (the source region) 18 and the third SiC region (the p-well contact region) 20 is then formed. The first electrode (the source/p-well common electrode) 24 is formed with a Ni (nickel) barrier metal layer 24a and an Al metal layer 24b formed on the barrier metal layer 24a, for example. The Ni barrier metal layer 24a and the Al metal layer 24b may form an alloy through a reaction.

A conductive second electrode (a drain electrode) 36 is formed on the side of the second face of the SiC substrate 12. The second electrode (the drain electrode) 36 is made of Ni, for example.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

In the following, the function and effects of this embodiment are described in detail.

The results of studies made by the inventors have made clear that pairing between Al and N can be caused by co-doping SiC with Al as the p-type impurity (p-type dopant) and N as the n-type impurity (n-type dopant). In this pairing state, carriers are compensated and are put into a zero state.

Figure 2:
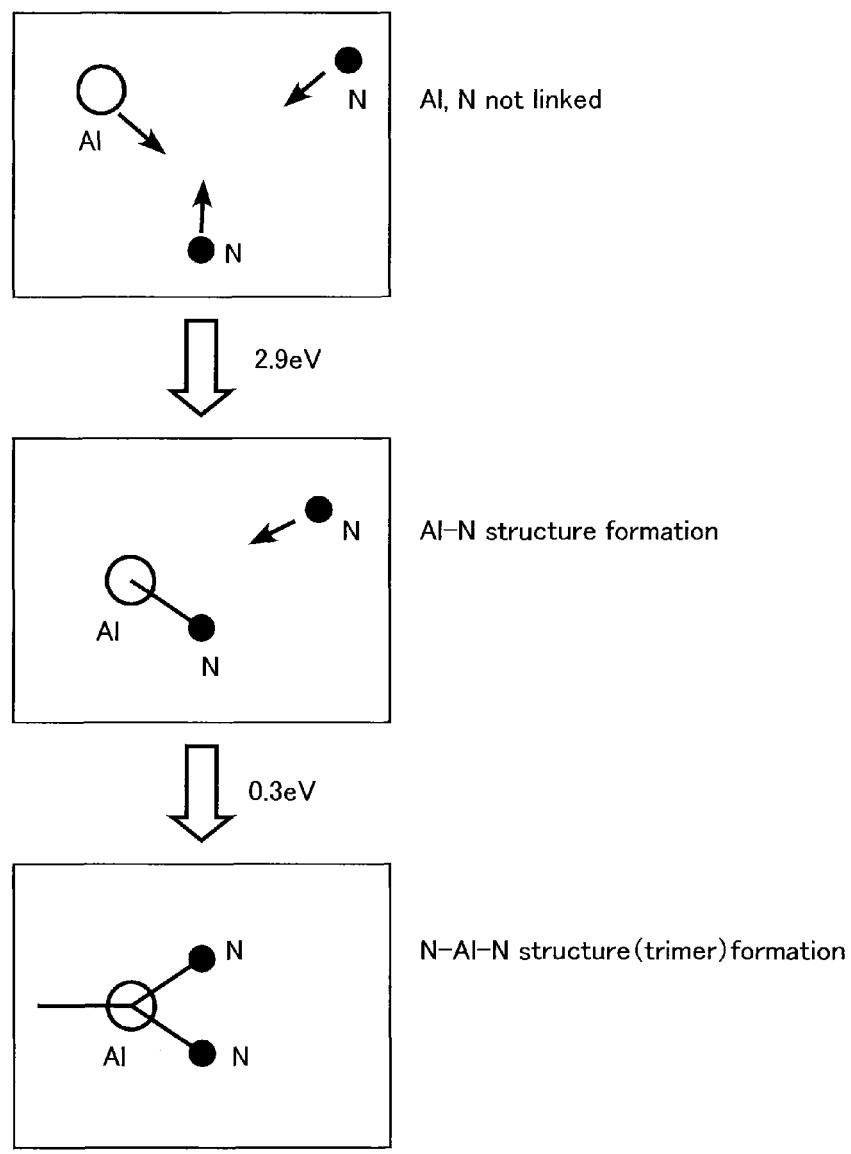
FIG. 2 is a diagram for explaining the function of co-doping.
Figure 3:
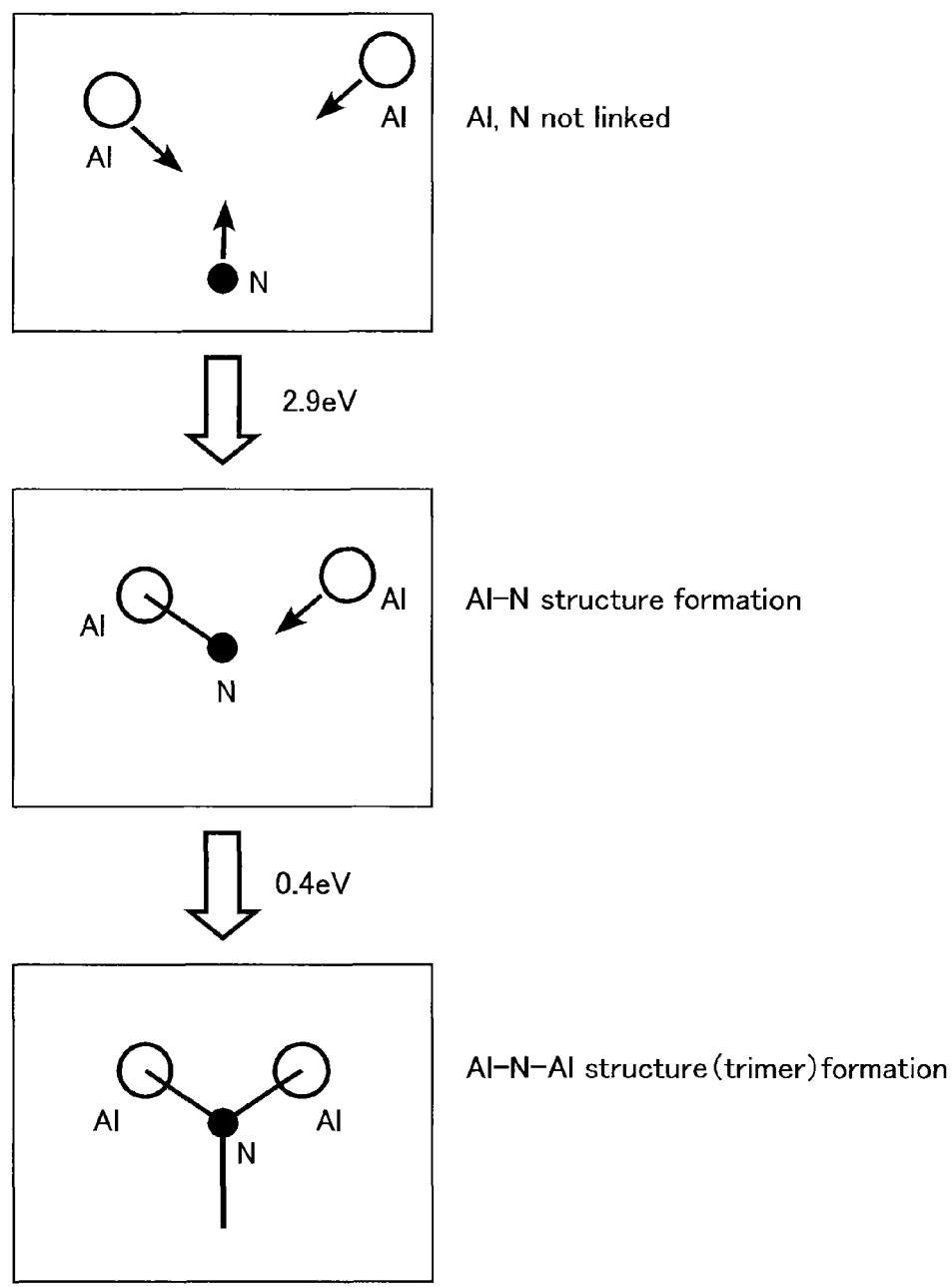
FIG. 3 is a diagram for explaining the function of co-doping.

FIGS. 2 and 3 are diagrams for explaining the function of co-doping. FIG. 2 shows the case of n-type SiC, and FIG. 3 shows the case of p-type SiC. The first principle calculation performed by the inventors has made it clear that Al enters Si (silicon) sites and N enters C (carbon) sites in SiC so that Al and N become adjacent to each other, and, as a result, the system becomes more stable.

Specifically, as shown in FIGS. 2 and 3, where Al and N are linked to each other to form an Al—N pair structure, the system becomes 2.9 eV more stable in terms of energy than that in a situation where Al and N are not linked to each other but exist independently of each other. If the Al amount and the N amount are the same, the most stable state is achieved as all of the two elements form pair structures.

Here, the first principle calculation is a calculation using ultrasoft pseudopotential. Ultrasoft pseudopotential is a type of pseudopotential, and was developed by Vanderbilt et al. For example, a lattice constant has such a high precision as to realize experimental values with a margin of error of 1% or smaller. Structural relaxation is performed by introducing impurities (dopant), and the entire energy of a stable state is calculated. The energy of the entire system after a change is compared with the energy prior to the change, so as to determine which structure is in a stable state. In a stable state, the energy position of the impurity level in the band gap can be indicated.

As shown in FIG. 2, it has become apparent that, in a case where the amount of N is larger than the amount of Al or in the case of n-type SiC, extra N enters a C site located in the vicinity of an Al—N pair structure, to form an N—Al—N trimer and further stabilize the system. According to the first principle calculation, a trimer is formed, and the system becomes 0.3 eV more stable than that in a case where pair structures exist separately from N.

Likewise, as shown in FIG. 3, it has become apparent that, in a case where the amount of Al is larger than the amount of N or in the case of p-type SiC, extra Al enters an Si site located in the vicinity of an Al—N pair, to form an Al—N—Al trimer and further stabilize the system. According to the first principle calculation, a trimer is formed, and the system becomes 0.4 eV more stable than that in a case where Al—N pair structures exist separately from Al.

Next, a dopant combination other than the combination of Al and N is discussed. Calculation results obtained in a case where a calculation was conducted for a combination of B (boron) and N (nitrogen) are described below.

B enters Si sites, and N enters C sites. According to the first principle calculation, B-N-B or N-B-N trimeric structures cannot be formed. Specifically, B-N pair structures are formed, but the energy of the system becomes higher when B or N approaches the B-N pair structures. However, the system is more stable in terms of energy when extra B or N exists in positions sufficiently away from the pair structures.

According to the first principle calculation, when extra B forms trimers, the energy of the system is 0.5 eV higher than that in a case where B-N pairs exist independently of B. Also, when N forms trimers, the energy of the system is 0.3 eV higher than that in a case where B-N pairs exist independently of N. Therefore, in either case, the system becomes unstable when trimers are formed.

Figure 4:
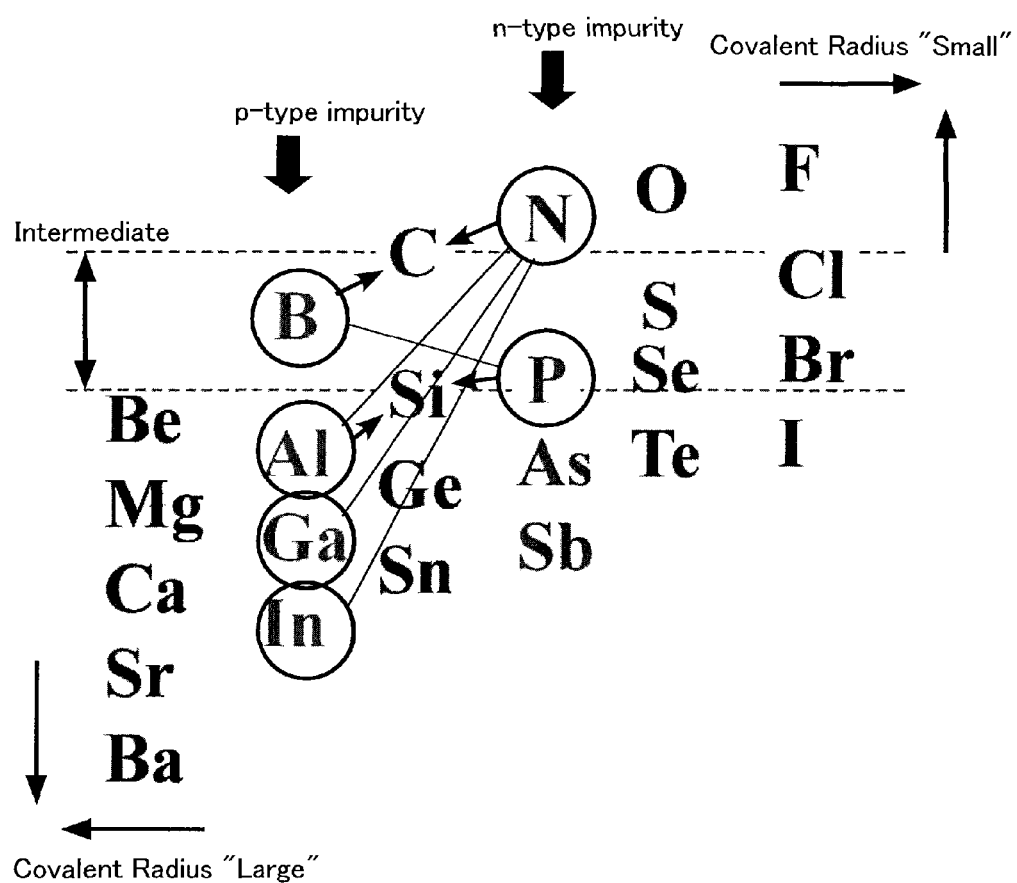
FIG. 4 is a diagram for explaining the function of co-doping.

FIG. 4 is a diagram for explaining the function of co-doping. FIG. 4 shows the covalent radii of respective elements. Elements with smaller covalent radii are shown in the upper right portion in the drawing, and elements with larger covalent radii are shown in the lower left portion.

Considering the covalent radii, it is understandable that the system becomes unstable when trimers are formed with B and N. The covalent radius of B is smaller than the covalent radius of Si, and the covalent radius of N is smaller than the covalent radius of C. Therefore, when B enters Si sites and N enters C sites, strain accumulates, and trimers cannot be formed.

It has become apparent that trimers are not formed with combinations of the p-type impurity and the n-type impurity as dopant other than the combinations of "an element (Al, Ga, or In) having a larger covalent radius than that of Si" and "an element (N) having a smaller covalent radius than that of C" and the reverse combination of "an element (B) having a larger covalent radius than that of C" and "an element (P) having a smaller covalent radius than that of Si".

Since the covalent radii of B and P are between the covalent radius of Si and the covalent radius of C, B and P can enter both Si sites and C sites. However, the other impurities (Al, Ga, In, N, and As) basically enter either Si sites or C sites. It is safe to say that Al, Ga, In, and As enter Si sites, and N enters C sites.

Furthermore, when both impurities enter Si sites or both impurities enter C sites, there is no need to consider such matter. This is because it is difficult to relax strain unless the p-type impurity and the n-type impurity are located at the closest distance from each other. Therefore, where the p-type impurity is the element A and the n-type impurity is the element D, it is difficult to form trimers with combinations of the element A and the element D other than the four combinations of Al and N, Ga and N, In and N, and B and P.

The pair structures or the trimeric structures cannot be formed unless there is interaction between atoms. If approximately 10 unit cells exist in the c-axis direction, the interaction becomes invisible, the impurity level (dopant level) in a 4H—SiC structure according to the first principle calculation becomes flat. That is, diffusion is sufficiently restrained, and is on the order of approximately 10 meV.

In other words, it is considered that there is little interaction when the distance between impurities is 10 nm or longer. In view of this, to maintain interaction between impurities, the impurity concentration is preferably $1 \times 10^{18}$ cm$^{-3}$ or higher.

This value is the lower limit of the impurity concentration desired when a local impurity distribution is formed through ion implantation in a case where an SiC material has already been formed.

To cause an effect of co-doping to appear in semiconductor SiC, the rates of the n-type impurity concentration and the p-type impurity concentration need to be restricted within a specific range. By the later described manufacturing method, it is critical that the respective rates of the n-type and p-type impurities to be introduced by ion implantation be set at rates within the specific range from the start. Although the reach of interaction is as small as 10 nm or less, trimers can be formed by virtue of the attraction force of each other within the reach. Furthermore, as the attraction force is applied, the temperature of the activating anneal for the impurities can be lowered from 1700-1900° C., which is the temperature range in a case where co-doping is not performed, to 1500-1800° C.

However, the impurity concentration desirable for trimer formation can be lowered in crystal growth from a vapor phase by CVD (Chemical Vapor Deposition) or the like. This is because raw material can be made to flow in the surface, and accordingly, interaction between the impurities can easily occur at low densities.

In vapor phase growth, the range of impurity densities for trimer formation is $1 \times 10^{15}$ cm$^{-3}$ to $1 \times 10^{22}$ cm$^{-3}$, which is wider than that with ion implantation. In vapor phase growth, it is possible to lower the SiC impurity concentration to approximately $1 \times 10^{16}$ cm$^{-3}$ or increase the SiC impurity to approximately $1 \times 10^{21}$ cm$^{-3}$, for example. Particularly, it is difficult to form an impurity region in a low-concentration region through ion implantation. Therefore, impurity region formation through vapor phase growth is particularly effective in a low-concentration region. Furthermore, it is possible to a co-doped film as thin as 5 nm, for example, through vapor phase growth.

Vapor phase growth also has the advantage that defects in crystals are not easily formed in regions containing impurities at high densities. In the case of ion implantation, defects in crystals increase as the amount of introduced impurities becomes larger, and recovery through a heat treatment or the like also becomes difficult. By vapor phase growth, trimers are formed during the growth, and defects due to impurity implantation are hardly formed. In view of this, impurity region formation through vapor phase growth is effective in regions having impurity densities of $1 \times 10^{19}$ cm$^{-3}$ or higher, or more preferably, $1 \times 10^{20}$ cm$^{-3}$ or higher, for example.

As described above, vapor phase growth has effects that cannot be achieved by ion implantation. However, impurity regions that are locally co-doped can be formed through ion implantation. Also, co-doped impurity regions can be formed at low costs. Therefore, either vapor phase growth or ion implantation should be used where appropriate.

When trimers are to be formed at the time of crystal growth from a vapor phase, the densities of the p-type and n-type impurities are preferably $1 \times 10^{15}$ cm$^{-3}$ or higher. Further, so as to facilitate the trimer formation, the impurity densities are preferably $1 \times 10^{16}$ cm$^{-3}$ or higher.

When trimers are formed, the upper limit of impurity densities may exceed the solid solubility limit of cases where trimers are not formed. This is because, when trimers are formed, strain in crystals is relaxed, and the impurities are easily solved.

The impurity solid solubility limit in a case where trimers are not formed is on the order of $10^{19}$ cm$^{-3}$ in the case of N, and is on the order of $10^{21}$ cm$^{-3}$ even in the case of Al. As for the other impurities, the solid solubility limit is on the order of approximately $10^{21}$ cm$^{-3}$.

When only one type of impurity is used, the size of the impurity is either small or large. Therefore, strain accumulates, and impurity cannot easily enter lattice points. As a result, activation cannot be caused. Particularly, in the case of ion implantation, a large number of defects are formed, and the solid solubility limit becomes even lower.

However, when trimers are formed, both Al and N can be implanted on the order of approximately $10^{22}$ cm$^{-3}$. As strain can be relaxed by forming trimers with one of the four combinations of Al and N, Ga and N, In and N, and B and P, the solid solubility limit can be extended. As a result, the impurity solid solubility limit can be extended to the order of $10^{22}$ cm$^{-3}$.

In a case where the impurity is B, Al, Ga, In, or P, strain is large, and a large number of defects exist, if the impurity concentration is $1 \times 10^{20}$ cm$^{-3}$ or higher, or more particularly, $6 \times 10^{20}$ cm$^{-3}$ or higher. As a result, sheet resistance or resistivity becomes very high.

However, co-doping with the p-type impurity and the n-type impurity can reduce defects even in regions having such high impurity densities.

When an impurity is N, the solid solubility limit is further lowered by one digit to approximately $2 \times 10^{19}$ cm$^{-3}$. According to the first principle calculation, this is probably because defects of inactive interstitial N are formed.

As trimers are formed, the upper limit of the N concentration is dramatically increased from the order of $10^{19}$ cm$^{-3}$ to the order of $10^{22}$ cm$^{-3}$. In a case where an n-type region doped at a high concentration is formed, nitrogen cannot be normally used, and P ions are implanted at approximately $10^{20}$ cm$^{-3}$, for example. In this embodiment, however, an n-type region doped at a high concentration can be formed by using nitrogen. For example, N is implanted at $2 \times 10^{20}$ cm$^{-3}$, and Al is implanted at $1 \times 10^{20}$ cm$^{-3}$. It has been difficult to use nitrogen, but nitrogen can be used in this embodiment.

As described above, both the p-type impurity and the n-type impurity are implanted, and an appropriate combination of covalent radii is selected, so that trimers can be formed. The structure is then stabilized, and strain can be reduced.

As a result, (1) the respective impurities can easily enter lattice points, (2) the process temperature can be lowered, and a temperature decrease of at least 100° C. can be expected, (3) the amount of impurities that can be activated increases (the upper limit increases), (4) stable structures such as trimers or pair structures are formed, and entropy is increased and crystal defects are reduced with the structures, and (5) as the trimers are stable, revolutions around the bonds that bind the p-type impurity and the n-type impurity become difficult, and the structures are immobilized. Accordingly, energization breakdown tolerance becomes dramatically higher. For example, when trimeric structures are formed in at least part of the p-type impurity region and the n-type impurity region of a pn junction, energization breakdown is restrained, and an increase in resistance can be avoided. As a result, a degradation phenomenon (Vf degradation) in which the applied voltage (Vf) required in applying a certain amount of current can be restrained.

As described above, pairing between Al and N can be caused by co-doping with Al as the p-type impurity and N as the n-type impurity. Furthermore, it has become apparent from the first principle calculation that both acceptor levels and donor levels can be made shallower at this point.

Figure 5:
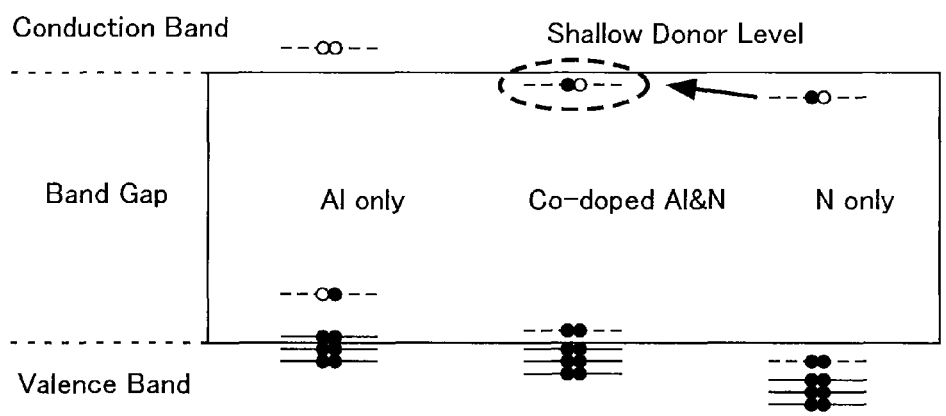
FIG. 5 is a diagram for explaining the function of co-doping.
Figure 6:
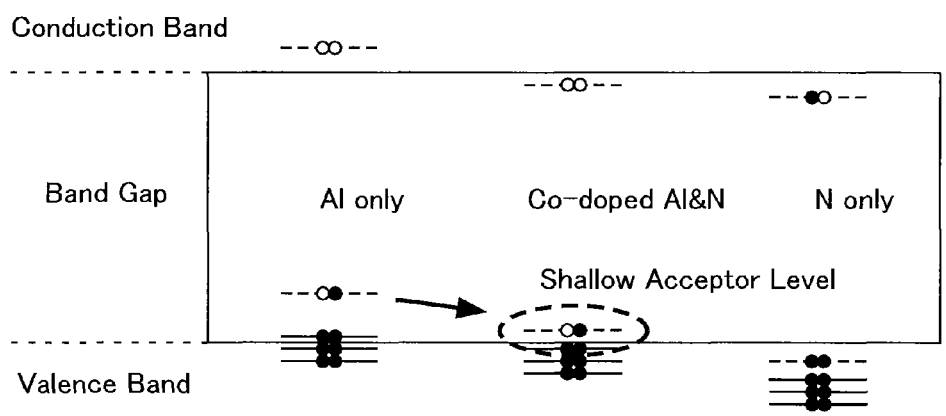
FIG. 6 is a diagram for explaining the function of co-doping.

FIGS. 5 and 6 are diagrams for explaining the function of co-doping. FIG. 5 illustrates a case of n-type SiC, and FIG. 6 illustrates a case of p-type SiC. White circles represent empty levels not filled with electrons, and black circles represent levels filled with electrons.

The reason that the donor levels become shallower is that the empty level located within the conduction band of Al as the acceptor interacts with the donor levels of N, and the donor levels are raised, as shown in FIG. 5. Likewise, the reason that the acceptor levels become shallower is that the level that is filled with electrons and is located within the valence band of N as the donor interacts with the acceptor levels of Al, and the acceptor levels are lowered, as shown in FIG. 6.

Normally, N or P (phosphorus) as the n-type impurity forms donor levels that are as deep as 42 to 95 meV. B, Al, Ga, or In as the p-type impurity forms very deep acceptor levels of 160 to 300 meV. If trimers are formed, on the other hand, the n-type impurity can form donor levels of 35 meV or less, and the p-type impurity can form acceptor levels of 100 meV or less.

In an optimum state where trimers are completely formed, n-type N or P forms a level of approximately 20 meV, and p-type B, Al, Ga, or In forms a level of approximately 40 meV. As such shallow levels are formed, most of the activated impurities turn into carriers (free electrons and free holes). Accordingly, the bulk resistance becomes one or more digits lower than that in a case where co-doping is not performed.

In the case of n-type SiC, the donor levels that contribute to carrier generation becomes 40 meV or less, and as a result, the resistance becomes lower than that in a case where co-doping is not performed. Also, as the donor levels become 35 meV or less, the resistance is lowered by one digit. As the donor levels become 20 meV or less, the resistance is lowered by approximately two digits. However, a strain relaxation effect and a doping upper limit extension effect are also achieved.

In the case of p-type SiC, the acceptor levels that contribute to carrier generation becomes 150 meV or less, and as a result, the resistance becomes lower than that in a case where co-doping is not performed. Also, as the acceptor levels become 100 meV or less, the resistance is lowered by one digit. As the acceptor levels become 40 meV or less, the resistance is lowered by approximately two digits. However, a strain relaxation effect and a doping upper limit extension effect are also achieved.

When the Al concentration and the N concentration are the same (N:Al=1:1), an insulator is formed, because there are no carriers though there are shallow levels. Carriers that are equivalent to a difference between the Al concentration and the N concentration are generated. To form a low-resistance semiconductor, a concentration difference is required.

When the N concentration is higher than the Al concentration (N concentration>Al concentration), extra N generated as a result of formation of Al—N pairs through interaction is also stabilized by displacing C located in the vicinities of the Al—N pairs. Accordingly, shallow donor levels are formed. Also, strain is relaxed. Accordingly, the N concentration can be made higher than that in a case where trimers are not formed.

Figure 7:
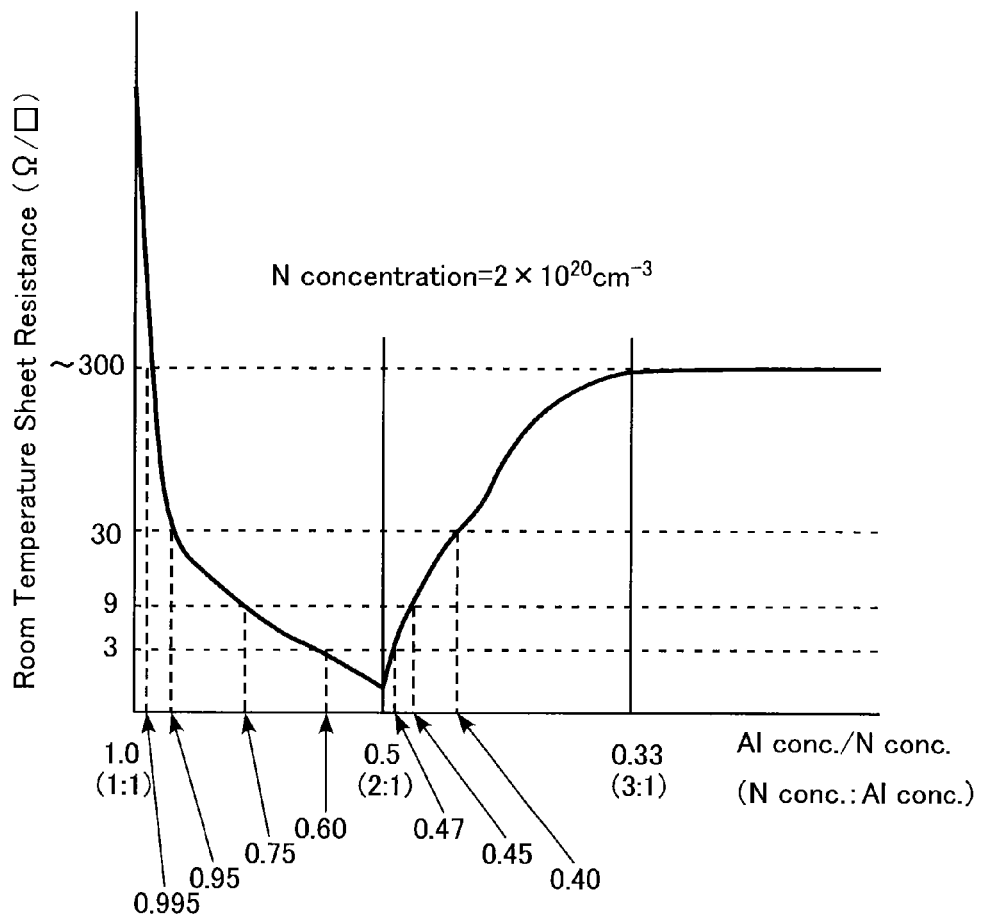
FIG. 7 is a diagram showing the relationship between Al and N densities and sheet resistance in the case of n-type SiC.

FIG. 7 is a diagram showing the relationship between Al and N densities and sheet resistance in the case of n-type SiC. The N concentration is $2 \times 10^{20}$ cm$^{-3}$. When only N is implanted, the sheet resistance cannot be lowered even if the concentration of the implanted N is $1 \times 10^{19}$ cm$^{-3}$ or higher. The value is approximately 300 Ω/□.

While "N concentration:Al concentration" is changing from 1:1 to 2:1, trimers are formed without strain, and the number of carrier electrons in the shallow donor levels increases. Accordingly, the sheet resistance rapidly decreases.

When the ratio reaches 2:1, the maximum amount of carriers is available, and the sheet resistance becomes lowest. As shown in FIG. 7, the sheet resistance can be lowered down to approximately 1.5Ω/□. The contact resistance to n-type SiC can also be lowered from approximately $10^{-5}$ cm$^3$ to approximately $10^{-7}$ Ωcm$^3$ by making "N concentration:Al concentration" equal to 2:1 and increasing the difference between the N concentration and the Al concentration from $10^{20}$ cm$^{-3}$ to $10^{22}$ cm$^{-3}$.

Furthermore, if the ratio of the N concentration becomes higher than 2:1, the original deep donor levels are formed by the extra N that exceeds "N concentration:Al concentration=2:1". The donor levels receive carrier electrons, and the shallow donor levels formed with trimers becomes empty. The excess N left out from "N concentration:Al concentration=2:1" is similar to N introduced independently. Therefore, strain relaxation is difficult. As a result, the sheet resistance rapidly increases as shown in FIG. 7.

In FIG. 7, the target for comparison is the sheet resistance (approximately 300Ω/□ in this case) in a case where N (nitrogen) as the n-type impurity is implanted almost up to the solid solubility limit when co-doping with Al is not performed, and changes in the sheet resistance value seen when "N concentration:Al concentration" is changed from 2:1 are shown.

The following description centers around "Al concentration/N concentration=0.5", at which trimer structures are formed. In a case where "Al concentration/N concentration" is not lower than 0.47 and not higher than 0.60 (100% of the carriers of $8 \times 10^{19}$ cm$^{-3}$ or higher being free carriers), or where the p-type impurity at 47 to 60% with respect to the n-type impurity is implanted, the sheet resistance is two digits lower than the sheet resistance obtained in a case co-doping with Al is not performed. Such a concentration ratio is highly advantageous. When the ratio is lower than 0.5, shallow levels decrease, and strain is caused. As a result, the number of free carriers decreases, and carriers equivalent to $8 \times 10^{19}$ cm$^{-3}$ are obtained when the ratio is approximately 0.47.

In a case where the range is widened in both directions, and "Al concentration/N concentration" is not lower than 0.45 and not higher than 0.75 (100% of the carriers of $5 \times 10^{19}$ cm$^{-3}$ or higher being free carriers), or where Al at 45 to 75% with respect to N is implanted, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5 \times 10^{19}$ cm$^{-3}$ are obtained when the ratio is approximately 0.45. In a case where the range is further widened in both directions and "Al concentration/N concentration" is higher than 0.40 but lower than 0.95 (100% of the carriers of $1 \times 10^{19}$ cm$^{-3}$ or higher being free carriers), or where Al at 40 to 95% with respect to N is implanted, the sheet resistance becomes one digit lower. When the ratio is lower than 0.5, shallow levels decrease, and strain is caused. As a result, the number of free carriers decreases, and carriers equivalent to $1 \times 10^{19}$ cm$^{-3}$ are obtained when the ratio is approximately 0.40.

Better characteristics are achieved on the side where Al at 50% or more with respect to N is implanted, because strain is sufficiently relaxed. The 50% state is the state where two N atoms and one Al atom are clustered to form a trimer. When the ratio is lower than 50%, trimers are formed, and extra N exists. Since there is N that cannot form trimers, an equivalent amount of strain accumulates. N that cannot form trimers is the same as that introduced independently, and reaches the limit of strain in no time. When the amount of Al is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

At this point, "Al concentration/N concentration" is 0.995, and the number of carriers is almost the same as that in a case where co-doping is not performed. Since 100% of the carriers of $1\times10^{18}$ cm$^{-3}$ or higher, which is 0.5% of $2\times10^{20}$ cm$^{-3}$, are free carriers, the sheet resistance to be obtained with conventional nitrogen doping can be realized. Accordingly, the sheet resistance is almost the same as that in a case where co-doping is not performed. In a case where "Al concentration/N concentration" is 0.33 or where "N concentration:Al concentration" is 3:1, all carrier electrons are received not by shallow donor levels formed with trimers but by deep donor levels formed with extra N. Accordingly, the sheet resistance is almost the same as that in a case where co-doping is not performed. Therefore, a resistance lowering effect is achieved by co-doping in cases where "Al concentration/N concentration" is higher than 0.33 but lower than 0.995, or where Al at 33 to 99.5% with respect to N is implanted. With the margin of error being taken into account, it can be considered that the ratio of Al to N is higher than 33% but lower than 100%.

When the Al concentration is higher than the N concentration (Al concentration>N concentration), extra Al generated as a result of formation of Al—N pairs through interaction is also stabilized by displacing Si located in the vicinities of the Al—N pairs. Accordingly, shallow acceptor levels are formed. Also, strain is relaxed. Accordingly, the Al concentration can be made higher than that in a case where trimers are not formed. This case can be considered to be the same as the case where the N concentration is higher than the Al concentration.

Figure 8:
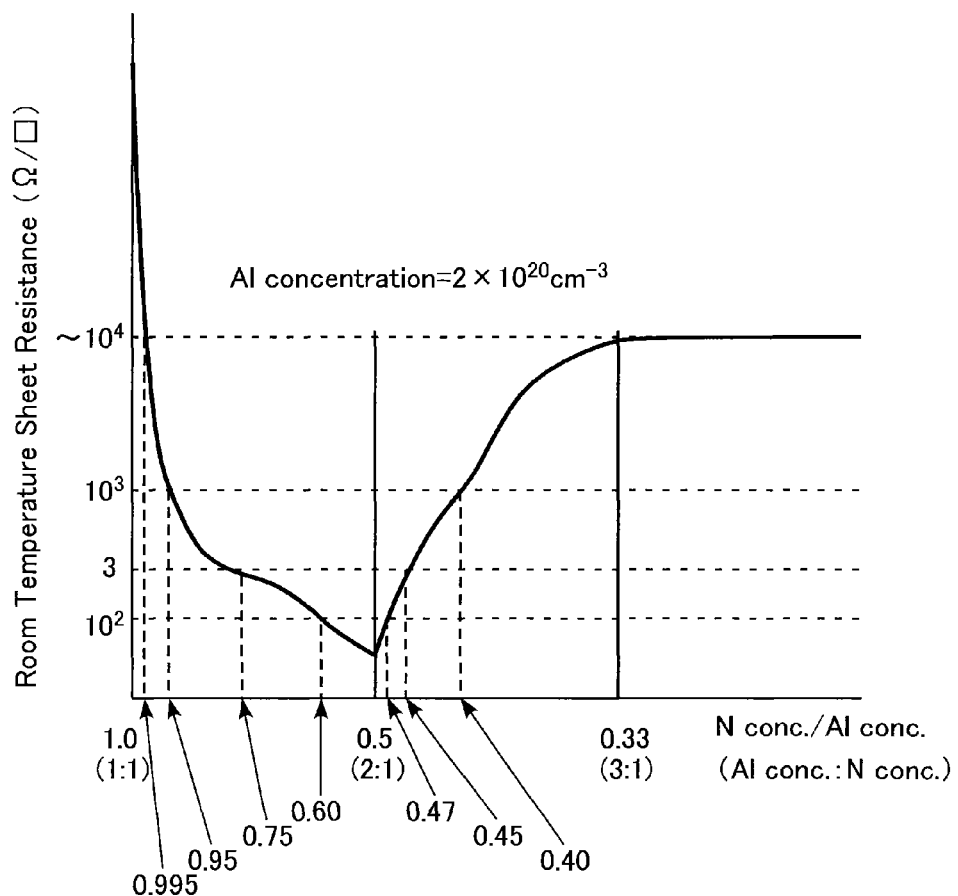
FIG. 8 is a diagram showing the relationship between N and Al densities and sheet resistance in the case of p-type SiC.

FIG. 8 is a diagram showing the relationship between N and Al densities and sheet resistance in the case of p-type SiC. The Al concentration is $2\times10^{20}$ cm$^{-3}$.

While "Al concentration:N concentration" is changing from 1:1 to 2:1, trimers are formed without strain, and the number of carrier holes in the shallow acceptor levels increases. Accordingly, the sheet resistance decreases.

When the ratio reaches 2:1, the maximum amount of carriers is available, and the sheet resistance becomes lowest. As shown in FIG. 8, the sheet resistance can be lowered down to approximately 40Ω/□. The contact resistance to p-type SiC can also be lowered from approximately $10^{-5}$ Ωcm$^3$ to approximately $10^{-7}$ Ωcm$^3$ by making "Al concentration:N concentration" equal to 2:1 and increasing the difference between the Al concentration and the N concentration from $10^{20}$ cm$^{-3}$ to $10^{22}$ cm$^{-3}$.

Furthermore, if the ratio of the Al concentration becomes higher than 2:1, the original deep acceptor levels are formed by the extra Al that exceeds "Al concentration:N concentration=2:1". The acceptor levels receive carrier holes, and the shallow acceptor levels formed with trimers are filled with electrons. The excess Al left out from "Al concentration:N concentration=2:1" is similar to N introduced independently. Therefore, strain relaxation is difficult. As a result, the sheet resistance rapidly increases as shown in FIG. 8.

In FIG. 8, the target for comparison is the sheet resistance (approximately 10 KΩ/□ in this case) in a case where Al (aluminum) as the p-type impurity is implanted almost up to the solid solubility limit when co-doping with N is not performed, and changes in the sheet resistance value seen when "Al concentration:N concentration" is changed from 2:1 are shown.

The following description centers around "N concentration/Al concentration=0.5", at which trimer structures are formed. In a case where "N concentration/Al concentration" is not lower than 0.47 and not higher than 0.60 (100% of the carriers of $8\times10^{19}$ cm$^{-3}$ or higher being free carriers), or where the n-type impurity at 47 to 60% with respect to the p-type impurity is implanted, the sheet resistance is two digits lower than the sheet resistance obtained in a case co-doping with N is not performed. Such a concentration ratio is highly advantageous. When the ratio is lower than 0.5, shallow levels decrease, and strain is caused. As a result, the number of free carriers decreases, and carriers equivalent to $8\times10^{19}$ cm$^{-3}$ are obtained when the ratio is approximately 0.47.

Ina case where the range is widened in both directions, and "N concentration/Al concentration" is not lower than 0.45 and not higher than 0.75 (100% of the carriers of $5\times10^{19}$ cm$^{-3}$ or higher being free carriers), or where N at 45 to 75% with respect to Al is implanted, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5\times10^{19}$ cm$^{-3}$ are obtained when the ratio is approximately 0.45. In a case where the range is further widened in both directions and "N concentration/Al concentration" is higher than 0.40 but lower than 0.95 (100% of the carriers of $1\times10^{19}$ cm$^{-3}$ or higher being free carriers), or where N at 40 to 95% with respect to Al is implanted, the sheet resistance becomes one digit lower. When the ratio is lower than 0.5, shallow levels decrease, and strain is caused. As a result, the number of free carriers decreases, and carriers equivalent to $1\times10^{19}$ cm$^{-3}$ are obtained when the ratio is approximately 0.40.

Better characteristics are achieved on the side where N at 50% or more with respect to Al is implanted, because strain is sufficiently relaxed. When N is less than 50%, on the other hand, trimers formed with one N atom and two Al atoms that are clustered account for 50% of the entire structure, and further, Al exists therein. Since there is Al that cannot form trimers, an equivalent amount of strain accumulates. When the amount of N is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

At this point, "N concentration/Al concentration" is 0.995, and the number of carriers is almost the same as that in a case where co-doping is not performed. Since 100% of the carriers of $1\times10^{18}$ cm$^{-3}$ or higher, which is 0.5% of $2\times10^{20}$ cm$^{-3}$, are free carriers, the sheet resistance to be obtained with conventional Al doping can be realized. Accordingly, the sheet resistance is almost the same as that in a case where co-doping is not performed. Ina case where "N concentration/Al concentration" is 0.33 or where "Al concentration:N concentration" is 3:1, all carrier holes are received not by shallow acceptor levels formed with trimers but by deep acceptor levels formed with extra Al. Accordingly, the sheet resistance is almost the same as that in a case where co-doping is not performed. Therefore, the resistance is lowered by co-doping in cases where "N concentration/Al concentration" is higher than 0.33 but lower than 0.995, or where N at 33 to 99.5% with respect to Al is implanted. With the margin of error being taken into account, it can be considered that the ratio of Al to N is higher than 33% but lower than 100%.

When co-doping is not performed, a low-resistance SiC semiconductor material containing impurities having low densities of $1 \times 10^{18}$ cm$^{-3}$ or lower cannot exist. However, when trimers are formed by co-doping, shallow levels are formed, and the number of carriers increases. Accordingly, a reduction in resistance can be achieved with small amounts of impurities.

Co-doping with the p-type impurity and the n-type impurity at an appropriate ratio as described above can achieve at least two notable effects.

First, strain is relaxed, and SiC with less strain can be formed. Compared with a case where co-doping is not performed, strain is smaller, the number of defects is smaller, and larger amounts of impurities can be implanted. That is, the solid solubility limits of impurities can be raised. Accordingly, the sheet resistance, the resistivity, and the contact resistance are lowered. As fewer defects are formed by either ion implantation or epitaxial growth, dosing of large amounts of impurities can be performed.

Secondly, shallow levels can be formed. Compared with a case where co-doping is not performed, a low-resistance material can be formed with smaller amounts of impurities. Alternatively, a sheet resistance that is one or more digits lower can be achieved with the same amounts of impurities as those in a case where co-doping is not performed. In a region that can be formed through epitaxial growth and contains a low-dose impurity, the resistance becomes higher unless co-doping is performed. However, low-resistance SiC can be formed when co-doping is performed. Accordingly, an SiC semiconductor device having a lower ON resistance can be manufactured.

In the MOSFET 100 of this embodiment, the n$^+$-type second SiC region (the source region) 18 is co-doped with a p-type impurity such as Al and an n-type impurity such as N. As a result, the sheet resistance and the resistivity of the n$^+$-type second SiC region (the source region) 18 is lowered. Also, the contact resistance between the second SiC region (the source region) 18 and the first electrode 24 is lowered. Accordingly, a reduction in the ON resistance is achieved, and the high-performance MOSFET 100 is realized.

As trimers are formed, the crystalline structures are stabilized, and crystal defects are reduced. Accordingly, the MOSFET 100 having smaller leak current is realized. Furthermore, as the crystalline structures are stabilized, the MOSFET 100 that has excellent energization breakdown tolerance is realized. Particularly, the body diode incorporated into the MOSFET 100 has high reliability in tolerance to deterioration due to energization.

As for deterioration due to energization, there is a mode in which crystal defects having 3C structures are formed, and the resistance becomes higher. With the co-doped structure of this embodiment, the crystals are stable, and such a mode does not appear. Accordingly, a highly-reliable body diode that does not cause the resistance increasing mode to appear can be formed.

The concentration of the n-type impurity contained in the second SiC region (the source region) 18 is not lower than $1 \times 10^{18}$ cm$^{-3}$ and not higher than $1 \times 10^{22}$ cm$^{-3}$. If the concentration is lower than the range, there is a possibility that interaction between the p-type impurity and the n-type impurity does not occur, and trimers are not formed, particularly when co-doping is performed through ion implantation. This is also because it is difficult to solve the n-type impurity having a concentration higher than the range.

So as to sufficiently lower the sheet resistance or the resistivity of the second SiC region (the source region) 18 and the contact resistance between the second SiC region (the source region) 18 and the first electrode 24, and lower the ON resistance, the concentration of the n-type impurity contained in the second SiC region 18 is preferably $1 \times 10^{20}$ cm$^{-3}$ or higher.

In a case where the p-type impurity is the element A and the n-type impurity is the element D in the second SiC region 18, the ratio of the concentration of the element A to the concentration of the element D is higher than 0.40 but lower than 0.95, so as to sufficiently lower the sheet resistance or the resistivity of the second SiC region 18 and the contact resistance between the second SiC region 18 and the first electrode 24, and lower the ON resistance. Also, the ratio of the concentration of the element A to the concentration of the element D is preferably not lower than 0.45 and not higher than 0.75. More preferably, the ratio is not lower than 0.47 and not higher than 0.60.

The ratio of the concentration of the element A to the concentration of the element D can be calculated by determining the respective densities of the element A and the element D by SIMS (Secondary Ion Microprobe Spectrometry), for example.

In a case where the p-type impurity is the element A and the n-type impurity is the element D in the second SiC region 18, the donor levels that contribute to generation of carriers of the element D is preferably 40 meV or less, so as to reduce the sheet resistance or the resistivity. More preferably, the donor levels are 35 meV or less. Even more preferably, the donor levels are 20 meV or less.

The donor levels of the element D can be determined by measuring the activation energy of the sheet resistance or the resistivity of the second SiC region 18 or the contact resistance between the second SiC region 18 and the first electrode 24, for example.

So as to sufficiently lower the sheet resistance or the resistivity of the second SiC region 18 and the contact resistance between the third SiC region 20 and the first electrode 24, and lower the ON resistance, most of the p-type impurity and the n-type impurity preferably forms trimers. Therefore, 90% or more of the element A is preferably in the lattice site locations nearest to the element D. If 90% or more of the element A is in the lattice site locations nearest to the element D, most of the p-type impurity and the n-type impurity (90% or more of the part that can form trimers) can be considered to form trimers.

The proportion of the element A in the lattice site locations nearest to the element D can be determined by analyzing the binding state between the element A and the element D by XPS (X-ray Photoelectron Spectroscopy), for example.

Next, a method of manufacturing the semiconductor device of this embodiment is described.

By the method of manufacturing the semiconductor device of this embodiment, a p-type impurity and an n-type impurity are implanted into SiC through ion implantation, to form an n-type SiC region. Where the p-type impurity is the element A and the n-type impurity is the element D, the element A and the element D form a combination of Al (aluminum), Ga (gallium), or In (indium) and N (nitrogen), and/or a combination of B (boron) and P (phosphorus). The ratio of the concentration of the element A to the concentration of the element D in the combination is higher than 0.40 but lower than 0.95. The ratio of the projected range (Rp) at the time of ion implantation of the p-type impurity to the projected range (Rp) at the time of ion implantation of the n-type impurity is in the range of 90% to 110%, and the concentration of the element D in the n-type SiC region is not lower than $1 \times 10^{18}$ cm$^{-3}$ and not higher than $1 \times 10^{22}$ cm$^{-3}$.

Figure 9:
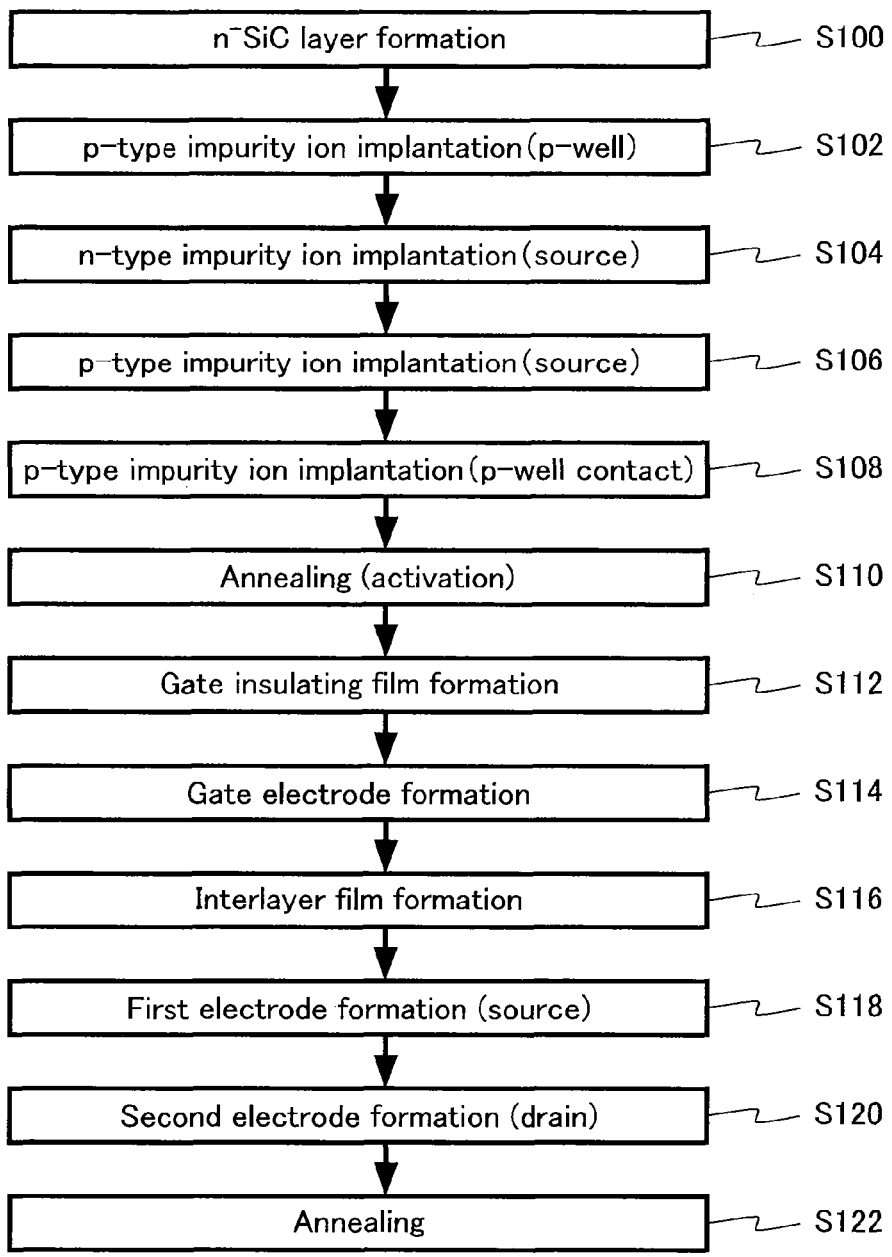
FIG. 9 is a process flowchart showing a method of manufacturing the semiconductor device of the first embodiment.

FIG. 9 is a process flowchart showing an example of the method of manufacturing the semiconductor device of this embodiment. FIGS. 10 through 14 are schematic cross-sectional views illustrating the method of manufacturing the semiconductor device of this embodiment.

As shown in FIG. 9, the method of manufacturing the semiconductor device includes n⁻-SiC layer formation (step S100), p-type impurity ion implantation (step S102), n-type impurity ion implantation (step S104), p-type impurity ion implantation (step S106), p-type impurity ion implantation (step S108), annealing (step S110), gate insulating film formation (step S112), gate electrode formation (step S114), interlayer film formation (step S116), first electrode formation (step S118), second electrode formation (step S120), and annealing (step S122).

First, the n-type SiC substrate 12 that contains P (phosphorus) or N (nitrogen) as the n-type impurity at an impurity concentration of approximately $5\times10^{18}$ cm$^{-3}$, has a thickness of 300 μm, for example, and has a low resistance of 4H—SiC, is prepared.

In step S100, the high-resistance n⁻-SiC layer 14 that contains N as the n-type impurity at an impurity concentration of approximately $1\times10^{16}$ cm$^{-3}$, for example, and has a thickness of approximately 10 μm is epitaxially grown on one of the faces of the SiC substrate 12 by an epitaxial growth technique.

Figure 10:
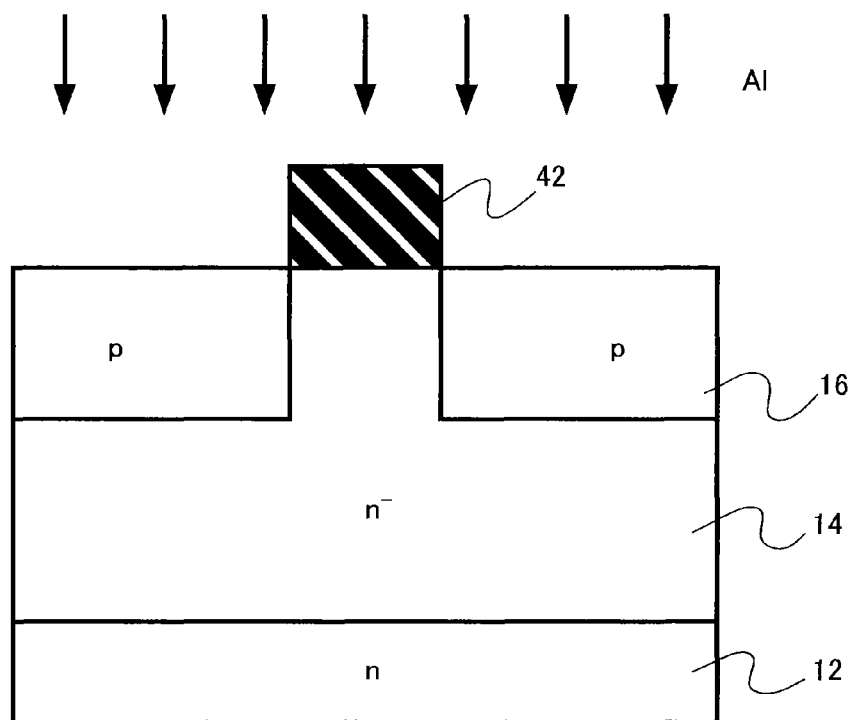
FIG. 10 is a schematic cross-sectional view illustrating the method of manufacturing the semiconductor device of the first embodiment.

After that, patterning is performed by photolithography and etching, to form a first mask material 42 that is made of SiO$_2$, for example. In step S102, Al as the p-type impurity is implanted into the n⁻-SiC layer 14 through ion implantation by using the first mask material 42 as an ion implantation mask, to form the first SiC region (the p-well region) 16 (FIG. 10).

Figure 11:
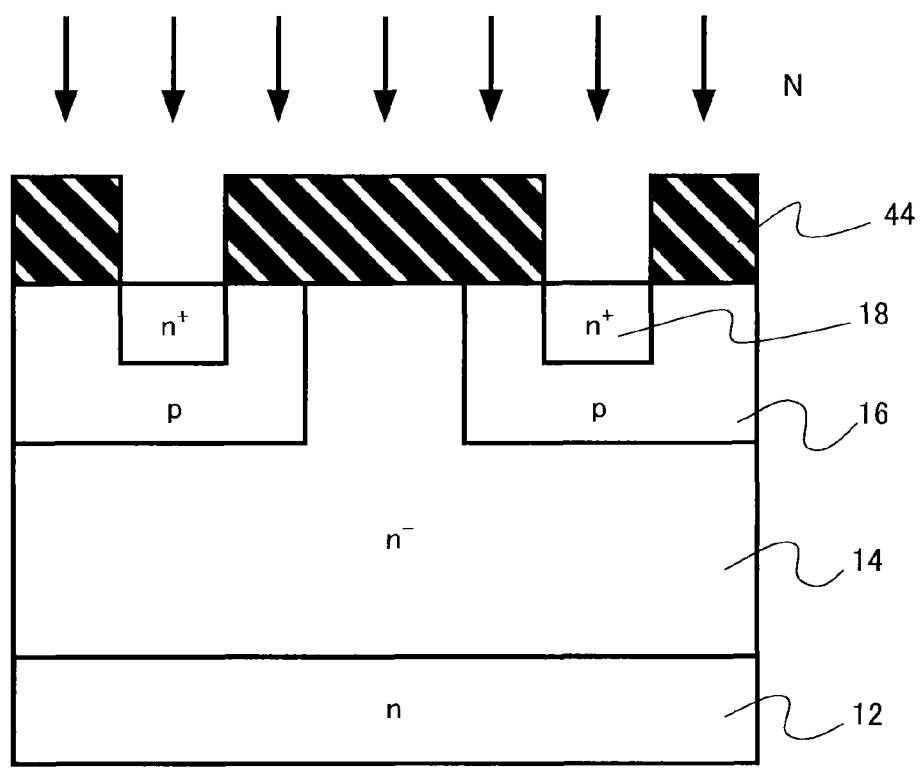
FIG. 11 is a schematic cross-sectional view illustrating the method of manufacturing the semiconductor device of the first embodiment.

After that, patterning is performed by photolithography and etching, to form a second mask material 44 that is made of SiO$_2$, for example. In step S104, N as the n-type impurity is implanted into the n⁻-SiC layer 14 through ion implantation by using the second mask material 44 as an ion implantation mask, to form the second SiC region (the source region) 18 (FIG. 11).

Figure 12:
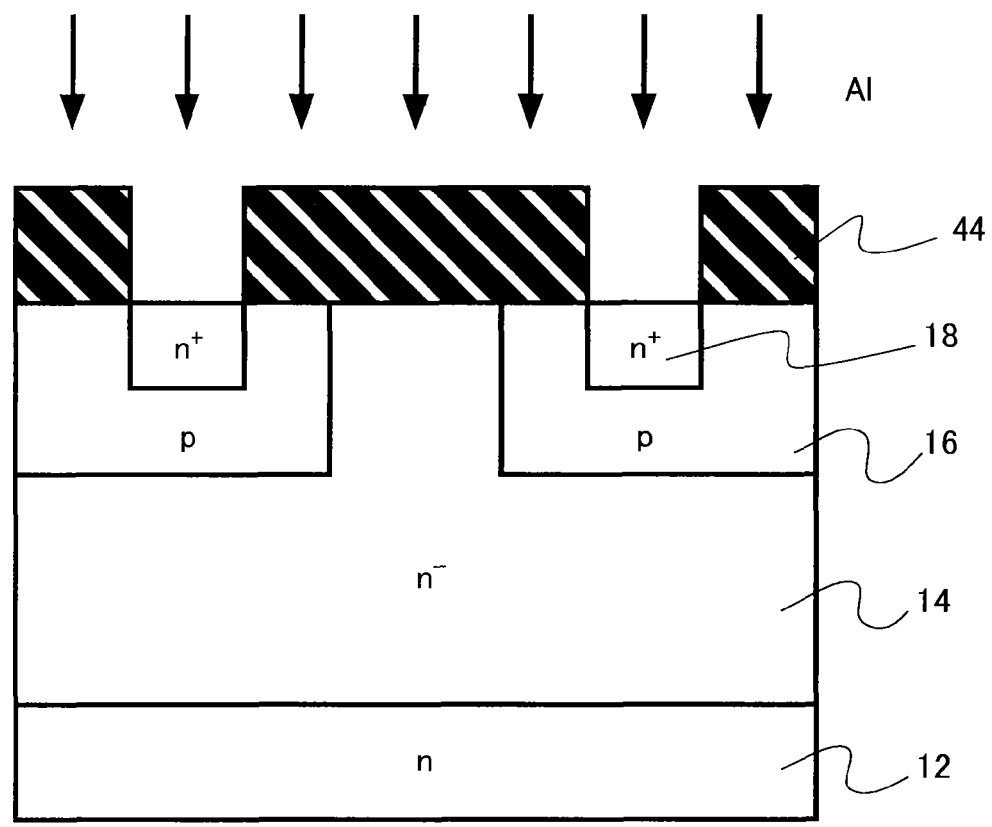
FIG. 12 is a schematic cross-sectional view illustrating the method of manufacturing the semiconductor device of the first embodiment.

In step S106, Al as the p-type impurity is implanted into the second SiC region (the source region) 18 through ion implantation by using the same second mask material 44 as an ion implantation mask (FIG. 12).

Figure 13:
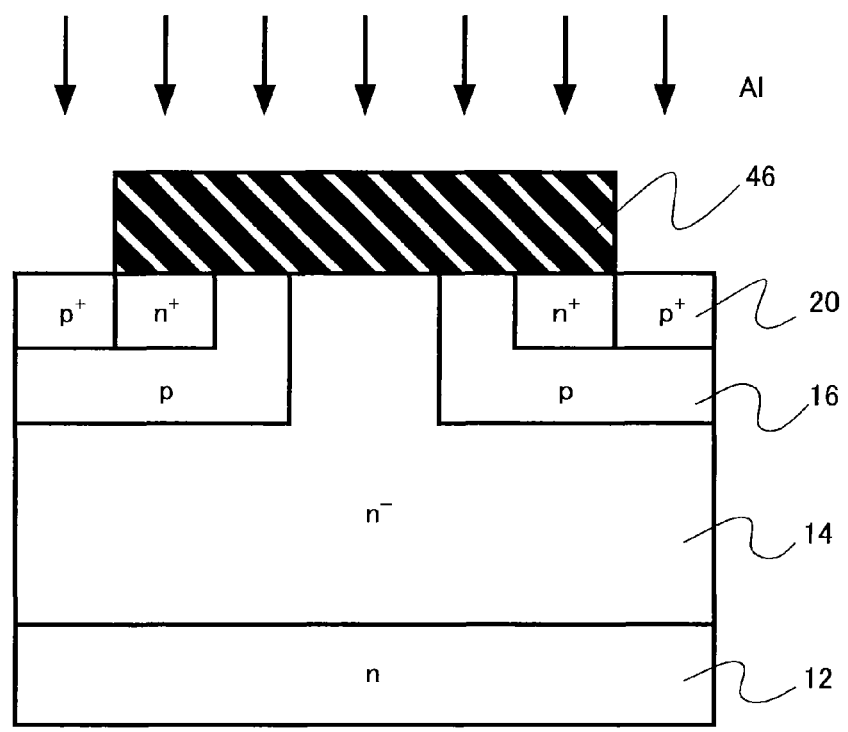
FIG. 13 is a schematic cross-sectional view illustrating the method of manufacturing the semiconductor device of the first embodiment.

After that, patterning is performed by photolithography and etching, to form a third mask material 46 that is made of SiO$_2$, for example. In step S108, Al as the p-type impurity is implanted into the n⁻-SiC layer 14 through ion implantation by using the third mask material 46 as an ion implantation mask, to form the third SiC region (the p-well contact region) 20 (FIG. 13).

As described above, in steps S104 and S106, co-doping is performed through ion implantation of the p-type impurity and the n-type impurity, to form the second SiC region (the source region) 18. Although the p-type impurity is Al and the n-type impurity is N in this example, the element A and the element D form a combination of Al (aluminum), Ga (gallium), or In (indium) and N (nitrogen), and/or a combination of B (boron) and P (phosphorus) in a case where the p-type impurity is the element A and the n-type impurity is the element D.

To form trimers through interaction between the p-type impurity and the n-type impurity in the second SiC region (the source region) 18, the distribution of the p-type impurity and the distribution of the n-type impurity that are multiplied by a certain percentage are substantially the same in respective locations in the film thickness direction after the ion implantation. Specifically, in the respective locations, conditions for implantation are set so that the ratio between the p-type impurity and the n-type impurity becomes a certain ratio (Al amount:N amount=2:1, for example).

Therefore, the ratio of the projected range (Rp) at the time of ion implantation of the p-type impurity to the projected range (Rp) at the time of ion implantation of the n-type impurity is set within the range of 90% to 110%. More preferably, the ratio is in the range of 95% to 105%.

The diffusion length of an impurity in SiC is shorter than that in Si. Therefore, the projected ranges (Rp) of the p-type impurity and the n-type impurity may be made to differ from each other, and the second SiC region (the source region) 18 may be formed by performing ion implantation in stages divided in accordance with the projected ranges (Rp). In this manner, the second SiC region (the source region) 18 having a more uniform concentration in the depth direction can be formed.

So as to lower the sheet resistance or the resistivity of the second SiC region (the source region) 18, the ratio of the dose amount of Al as the p-type impurity to the dose amount of N as the n-type impurity is higher than 0.40 but lower than 0.95.

Also, so as to lower the sheet resistance or the resistivity of the second SiC region (the source region) 18 through interaction between the p-type impurity and the n-type impurity, the dose amounts at the time of ion implantation are controlled so that the concentration of N as the n-type impurity becomes not lower than $1\times10^{18}$ cm$^{-3}$ and not higher than $1\times10^{22}$ cm$^{-3}$.

In step S110, after the source region 18 is formed by performing co-doping through ion implantation of the p-type impurity and the n-type impurity, annealing for activation is performed. The conditions for the annealing are that an argon (Ar) gas is used as an atmosphere gas, the heating temperature is 1600° C., and the heating period is 30 minutes, for example. At this point, the impurities implanted into the SiC can be activated, but diffusion is small.

Figure 14:
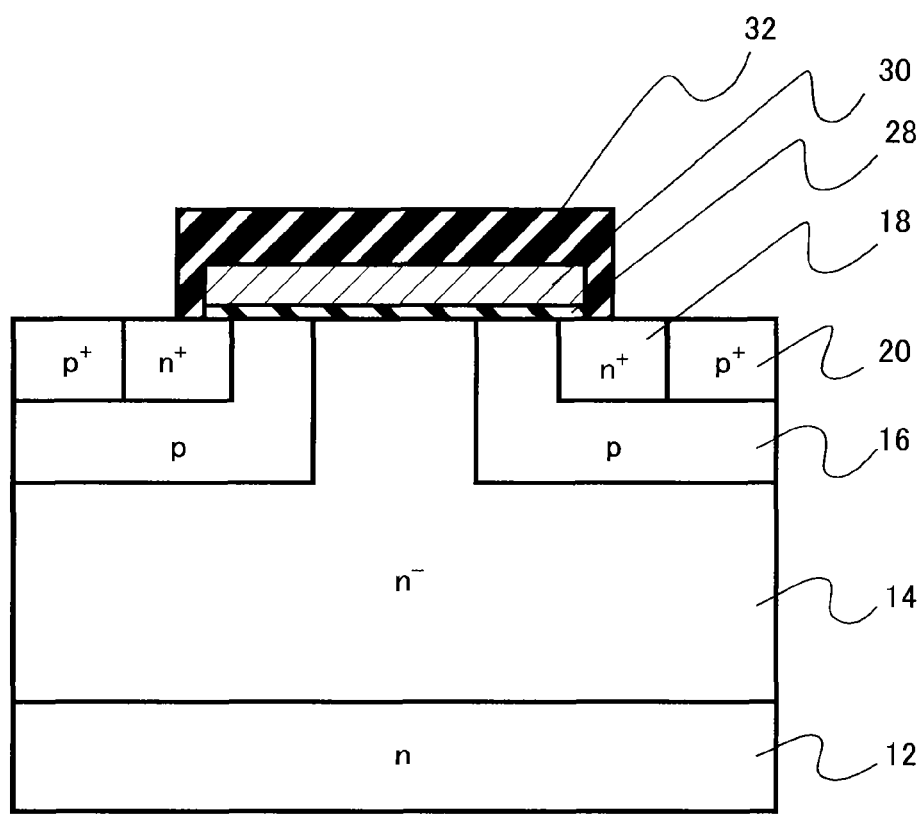
FIG. 14 is a schematic cross-sectional view illustrating the method of manufacturing the semiconductor device of the first embodiment.

In step S112, the gate insulating film 28 that is formed with an SiO$_2$ film, for example, is formed by CVD (Chemical Vapor Deposition) or thermal oxidation. In step S114, the gate electrode 30 that is made of polysilicon, for example, is formed on the gate insulating film 28. In step S116, the interlayer insulating film 32 that is formed with an SiO$_2$ film, for example, is formed on the gate electrode 30 (FIG. 14).

In step S118, the conductive first electrode (the source/p-well common electrode) 24 that is electrically connected to the second SiC region (the source region) 18 and the third SiC region (the p-well contact region) 20 is formed. The first electrode (the source/p-well common electrode) 24 is formed by Ni (nickel) and Al sputtering, for example.

In step S120, the conductive second electrode (the drain electrode) 36 is formed on the side of the second face of the n⁻SiC substrate 12. The second electrode (the drain electrode) 36 is formed by Ni sputtering, for example.

In step S122, annealing at a low temperature is performed to lower the contact resistance between the first electrode 24 and the second electrode 36. The annealing is performed in an argon gas atmosphere at 400° C., for example.

By the above described manufacturing method, the MOSFET 100 shown in FIG. 1 is formed.

According to the manufacturing method in this embodiment, the n⁺-type second SiC region (the source region) 18 is co-doped with a p-type impurity such as Al and an n-type impurity such as N. Accordingly, the sheet resistance or the resistivity of the n⁺-type second SiC region (the source region) 18 is lowered. Also, the contact resistance between the n⁺-type second SiC region (the source region) 18 and the first electrode 24 is lowered. Accordingly, the ON resistance is lowered, and the high-performance MOSFET 100 can be manufactured.

Also, the respective impurities can easily enter lattice points by virtue of the co-doping with the p-type impurity and the n-impurity. Accordingly, the temperature of the activating anneal in step S110 can be made lower than that in a case where co-doping is not performed.

Further, the crystalline structures are stabilized by the formation of trimers or pair structures, and characteristics degradation due to expansion of crystal defects formed at the time of ion implantation into SiC can be restrained.

In a case where an n-type region doped at a high concentration is formed, nitrogen cannot be normally used, and P (phosphorus) ions are implanted at approximately $10^{20}$ cm$^{-3}$, for example. In this embodiment, however, an n-type region doped at a high concentration can be formed by using nitrogen. It has been difficult to use nitrogen, but nitrogen can be used in this embodiment.

Second Embodiment

A semiconductor device of this embodiment is the same as that of the first embodiment, except that the p$^+$-type third SiC region (the p-well contact region) is also co-doped with a p-type impurity and an n-type impurity. Therefore, the same explanations as those in the first embodiment will not be repeated.

The semiconductor device of this embodiment is the same as the MOSFET 100 shown in FIG. 1, except that the p$^+$-type third SiC region (the p-well contact region) 20 is co-doped with a p-type impurity and an n-type impurity. Where the p-type impurity is an element A and the n-type impurity is an element D in the third SiC region (the p-well contact region) 20, the element A and the element D form a combination of Al (aluminum), Ga (gallium), or In (indium) and N (nitrogen), and/or a combination of B (boron) and P (phosphorus). For example, the element A is Al, and the element D is N.

In the MOSFET of this embodiment, the third SiC region (the p-well contact region) 20 is co-doped with a p-type impurity such as Al and an n-type impurity such as N. As a result, the sheet resistance or the resistivity of the third SiC region (the p-well contact region) 20 is lowered. Also, the contact resistance between the third SiC region (the p-well contact region) 20 and the first electrode 24 is lowered. Accordingly, in addition to the effects of the first embodiment, stabilization of the p-well potential (the channel potential) is achieved, and a high-performance MOSFET 100 is realized.

The concentration of the p-type impurity contained in the third SiC region (the p-well contact region) 20 is not lower than $1\times10^{18}$ cm$^{-3}$ and not higher than $1\times10^{22}$ cm$^{-3}$. If the concentration is lower than the range, there is a possibility that interaction between the p-type impurity and the n-type impurity does not occur, and trimers are not formed, particularly when co-doping is performed through ion implantation. This is also because it is difficult to solve the p-type impurity having a concentration higher than the range.

So as to sufficiently lower the sheet resistance or the resistivity of the third SiC region (the p-well contact region) 20 and the contact resistance between the third SiC region (the p-well contact region) 20 and the first electrode 24, and stabilize the p-well potential (the channel potential), the concentration of the p-type impurity contained in the third SiC region (the p-well contact region) 20 is preferably $1\times10^{20}$ cm$^{-3}$ or higher.

In a case where the p-type impurity is the element A and the n-type impurity is the element D in the third SiC region (the p-well contact region) 20, the ratio of the concentration of the element D to the concentration of the element A is higher than 0.33 but lower than 0.995, so as to achieve the effects of co-doping. Also, so as to sufficiently lower the sheet resistance or the resistivity of the third SiC region (the p-well contact region) 20 and the contact resistance between the third SiC region (the p-well contact region) 20 and the first electrode 24, and stabilize the p-well potential (the channel potential), the ratio of the concentration of the element D to the concentration of the element A is preferably higher than 0.40 but lower than 0.95. More preferably, the ratio is not lower than 0.45 and not higher than 0.75. Even more preferably, the ratio is not lower than 0.47 and not higher than 0.60.

In a case where the p-type impurity is the element A and the n-type impurity is the element D in the third SiC region (the p-well contact region) 20, the acceptor levels that contribute to generation of carriers of the element A are preferably 150 meV or less, so as to reduce the sheet resistance or the resistivity. More preferably, the acceptor levels are 100 meV or less. Even more preferably, the acceptor levels are 40 meV or less.

So as to sufficiently lower the sheet resistance or the resistivity of the third SiC region (the p-well contact region) 20 and the contact resistance between the third SiC region (the p-well contact region) 20 and the first electrode 24, and stabilize the p-well potential (the channel potential), most of the p-type impurity and the n-type impurity preferably forms trimers. Therefore, 90% or more of the element D is preferably in the lattice site locations nearest to the element A. If 90% or more of the element D is in the lattice site locations nearest to the element A, most of the p-type impurity and the n-type impurity (90% or more of the part that can form trimers) can be considered to form trimers.

Next, a method of manufacturing the semiconductor device of this embodiment is described.

Figure 15:
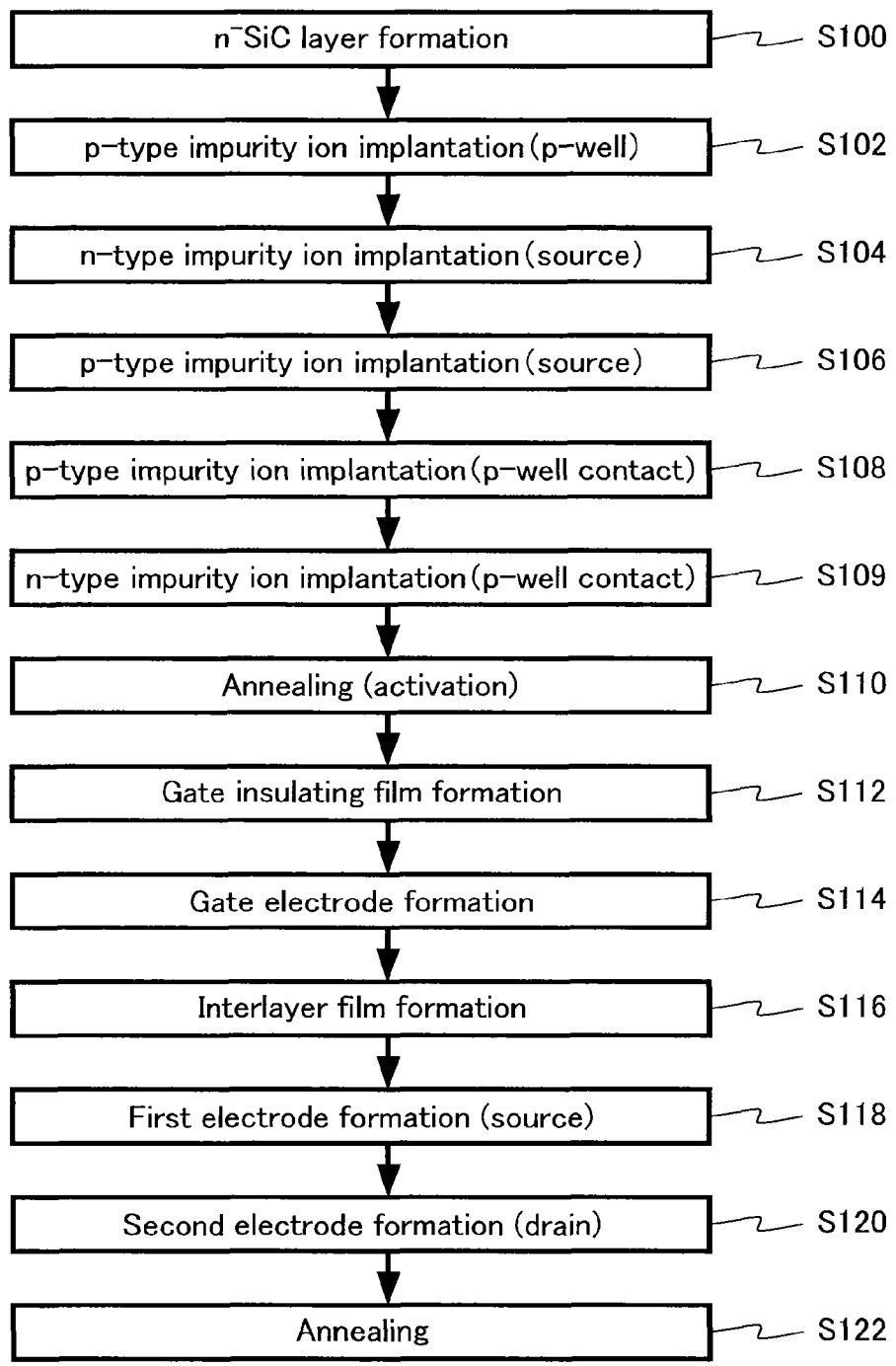
FIG. 15 is a process flowchart showing a method of manufacturing a semiconductor device of a second embodiment.
Figure 16:
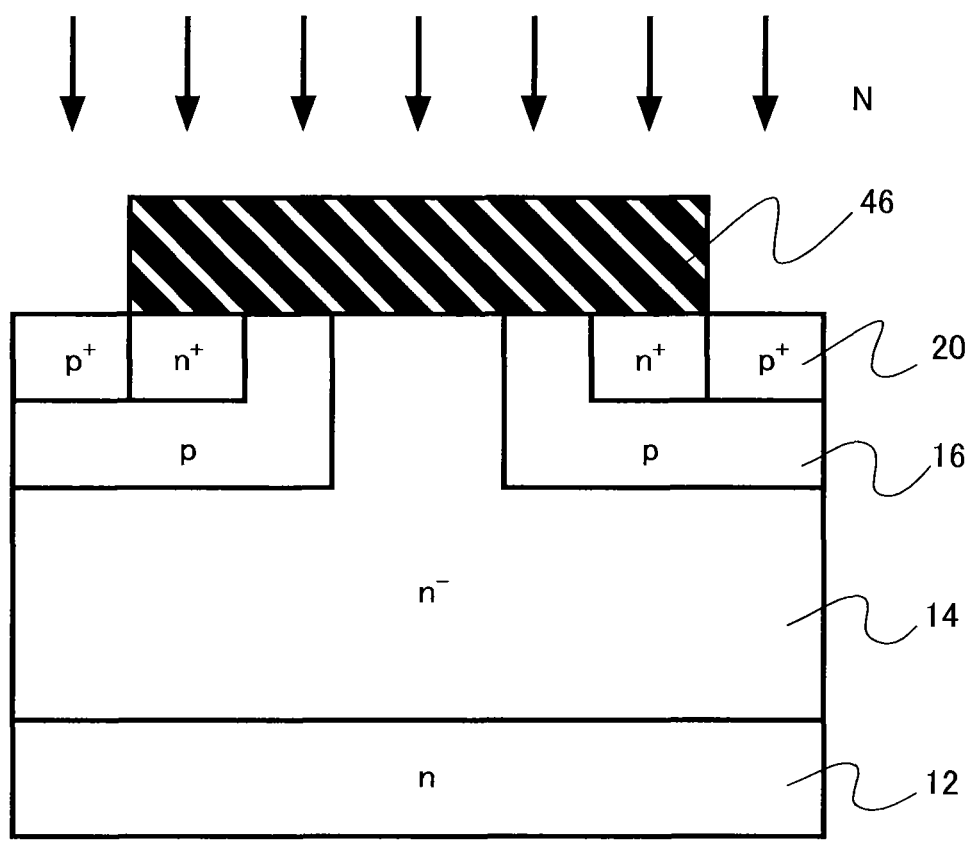
FIG. 16 is a schematic cross-sectional view illustrating the method of manufacturing the semiconductor device of the second embodiment.

FIG. 15 is a flowchart showing an example of the method of manufacturing the semiconductor device of this embodiment. FIG. 16 is a schematic cross-sectional view illustrating the method of manufacturing the semiconductor device of this embodiment.

As shown in FIG. 15, the method of manufacturing the semiconductor device is the same as the method of the first embodiment, except for further including n-type impurity ion implantation (step S109) after the p-type impurity ion implantation (step S108).

In step S109, Al as the p-type impurity is implanted into the third SiC region (the p-well contact region) 20 through ion implantation by using the same third mask material 46 as that used in step S108 as an ion implantation mask (FIG. 16).

So as to sufficiently lower the sheet resistance or the resistivity of the third SiC region (the p-well contact region) 20 and the contact resistance between the third SiC region (the p-well contact region) 20 and the first electrode 24, and stabilize the p-well potential (the channel potential), the ratio of the dose amount of N as the n-type impurity to the dose amount of Al as the p-type impurity is higher than 0.33 but lower than 0.995. From the same viewpoint as above, the dose amounts are controlled so that the concentration of Al as the p-type impurity becomes not lower than $1\times10^{18}$ cm$^{-3}$ and not higher than $1\times10^{22}$ cm$^{-3}$.

Step S110 and the process thereafter are the same as those in the first embodiment.

According to the manufacturing method of this embodiment, in addition to the effects of the first embodiment, stabilization of the p-well potential (the channel potential) is achieved, and the higher-performance MOSFET 100 can be manufactured.

In the first and second embodiments, the p-type first SiC region (the p-well region) 16 containing the p-type impurity at an impurity concentration of approximately $5 \times 10^{15}$ to $1 \times 10^{17}$ cm$^{-3}$ is formed in part of the surface of the n$^-$-SiC layer 14, and serves as the channel region of the MOSFET. If dopant at $1 \times 10^{18}$ cm$^{-3}$ or higher can be implanted, co-doping may be performed in this region as in the p-well contact region.

Normally, when the concentration of the p-type dopant in the channel region is made higher, electron mobility is degraded. However, strain is relaxed by co-doping, and higher mobility can be expected accordingly. Also, SiC normally has carbon defects, and electron trapping occurs at the energy levels, resulting in mobility degradation. However, if the channel region is co-doped, carbon defects are buried by n-type dopant (the dopant that enters C sites, to be accurate), and electron trapping does not occur. Improvement in mobility is also expected accordingly.

However, if dopant at $1 \times 10^{18}$ cm$^{-3}$ or higher is implanted into the channel region, a large threshold value becomes a problem. If a large threshold value is allowed, or if the threshold value can be reduced by some other technique, a high-performance MOSFET can be obtained by co-doping the p-well region (the channel region).

To do so, N and Al are implanted both at $1 \times 10^{18}$ cm$^{-3}$ or higher near the interface between the insulating film and the first SiC region while 0.33<N/Al<1.0 is maintained, and the difference between the p-type dopant and the n-type dopant is adjusted to $1 \times 10^{17}$ cm$^{-3}$ or lower in the portion forming the channel (approximately 3 to 5 nm).

The difference is preferably even smaller near the interface, and it is more preferable to form a buried channel. In the interface, the N/Al ratio may be 1.0. Further, a region that is 1 to 5 nm and has 1.0 as the N/Al ratio (since N and Al attract each other, an N/Al ratio in the range of 0.995 to 1.005 can be adjusted to 1.0) may be inserted as a buried structure. When there is such a buried structure, the portion behind the interface serves as the channel after the burying. The difference between the p-type dopant and the n-type dopant is gradually increased in the depth direction from the channel location toward the SiC region, while 0.33<N/Al<1.0 is maintained. That is, the N/Al ratio is close to 1.0 in the vicinity of the interface, and is closer to 0.5 in deeper locations.

At this point, (1) the threshold value is a normal value between 3 V and 5 V. (2) The mobility becomes higher as described above. To achieve this, it is critical that 0.33<N/Al<1.0 be maintained in the channel. (3) As a buried structure is formed, mobility degradation due to unevenness of the interface is prevented. (4) In the deepest location in the first SiC region, the concentration of the p-type dopant can be increased so that the difference between the p-type dopant and the n-type dopant becomes $1 \times 10^{18}$ cm$^{-3}$ or larger. Accordingly, a device with a higher withstand voltage can be formed.

Third Embodiment

A semiconductor device of this embodiment includes an SiC substrate having first and second faces, an n-type SiC layer formed on the side of the first face of the SiC substrate, a pair of p-type first SiC regions formed in the surface of the SiC layer, and a pair of n-type second SiC regions formed in the surfaces of the first SiC regions. Also, p-type third SiC regions are formed on the sides of the second SiC regions.

Further, an n-type fourth SiC region having a higher n-type impurity concentration than the SiC layer is formed at the portion located between the two p-type first SiC regions in the SiC layer. The n-type fourth SiC region contains a p-type impurity and an n-type impurity. Where the p-type impurity is an element A and the n-type impurity is an element D, the element A and the element D form a combination of Al (aluminum), Ga (gallium), or In (indium) and N (nitrogen), and/or a combination of B (boron) and P (phosphorus). The ratio of the concentration of the element A to the concentration of the element D in the combination is higher than 0.40 but lower than 0.95, and the concentration of the element D forming part of the combination is not lower than $1 \times 10^{18}$ cm$^{-3}$ and not higher than $1 \times 10^{22}$ cm$^{-3}$. The semiconductor device further includes a gate insulating film continuously formed on the surfaces of the SiC layer and the first SiC region, a gate electrode formed on the gate insulating film, a first electrode formed on the second SiC region, and a second electrode formed on the side of the second face of the SiC substrate.

Figure 17:
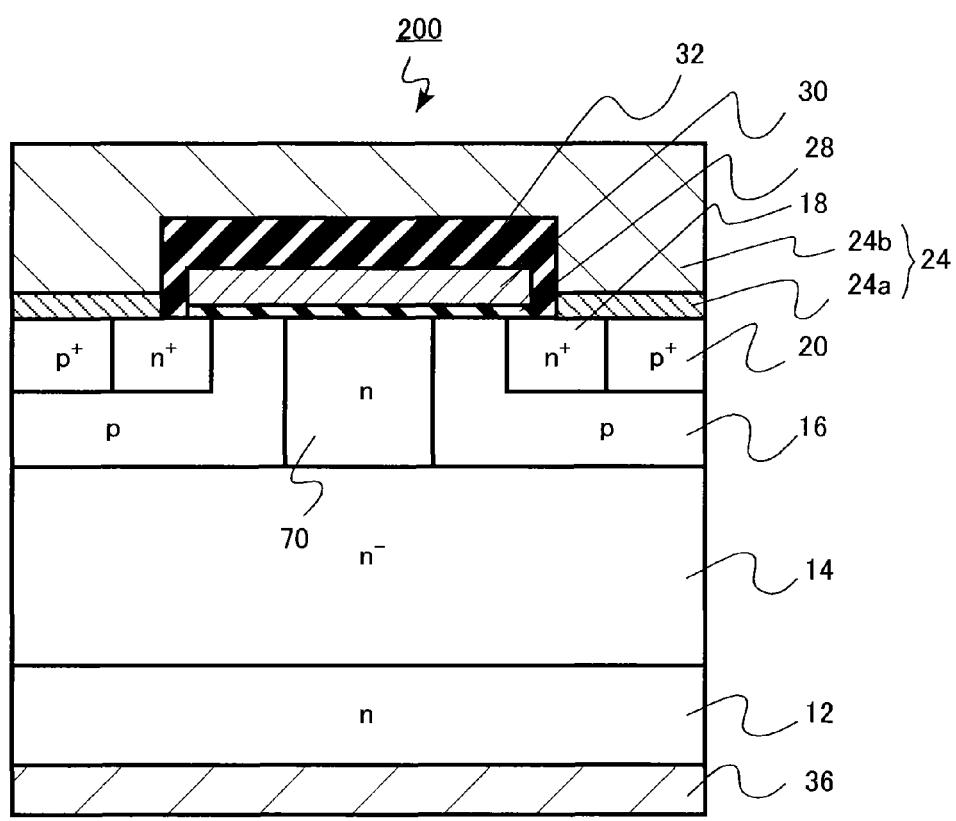
FIG. 17 is a schematic cross-sectional view of a semiconductor device of a third embodiment.

FIG. 17 is a schematic cross-sectional view of the structure of a MOSFET that is a semiconductor device of this embodiment. This MOSFET (Metal Oxide Semiconductor Field Effect Transistor) 200 is a Double Implantation MOSFET (DIMOSFET) having a p-well and a source region formed through ion implantation, for example.

This MOSFET 200 includes an SiC substrate (a silicon carbide substrate) 12 having first and second faces. In FIG. 17, the first face is the upper face, and the second face is the lower face. This SiC substrate 12 is an n-type 4H—SiC substrate (an n-substrate) that contains N (nitrogen) as the n-type impurity at an impurity concentration of approximately $1 \times 10^{18}$ to $1 \times 10^{19}$ cm$^{-3}$, for example.

An n-type SiC layer (an n$^-$-SiC layer) 14 containing the n-type impurity at an impurity concentration of approximately $5 \times 10^{15}$ to $2 \times 10^{16}$ cm$^{-3}$, for example, is formed on the first face of the SiC substrate 12. The film thickness of the n$^-$-SiC layer 14 is approximately 5 to 10 μm, for example.

A pair of p-type first SiC regions (p-well regions) 16 containing the p-type impurity at an impurity concentration of approximately $5 \times 10^{15}$ to $1 \times 10^{17}$ cm$^{-3}$ are formed in part of the surface of the n$^-$-SiC layer 14. The depth of the p-well regions 16 is approximately 0.6 μm, for example. The p-well regions 16 function as the channel region of the MOSFET 200.

A pair of n$^+$-type second SiC regions (source regions) 18 containing the n-type impurity at an impurity concentration of approximately $5 \times 10^{19}$ to $1 \times 10^{22}$ cm$^{-3}$, for example, are formed in part of the surfaces of the first SiC regions (the p-well regions) 16. The depth of the source regions 18 is smaller than the depth of the first SiC regions (the p-well regions) 16, and is approximately 0.3 μm, for example.

A pair of p$^+$-type third SiC regions (a p-well contact regions) 20 containing the p-type impurity at an impurity concentration of approximately $5 \times 10^{19}$ to $1 \times 10^{22}$ cm$^{-3}$, for example, are also formed in part of the surfaces of the first SiC regions (the p-well regions) 16 and on the sides of the n$^+$-type second SiC regions (the source regions) 18. The depth of the p-well contact regions 20 is smaller than the depth of the first SiC regions (the p-well regions) 16, and is approximately 0.3 μm, for example.

An n-type fourth SiC region (a current spreading layer) 70 is provided in the n$^-$-SiC layer 14. The current spreading layer 70 is formed between the two p-type first SiC regions (the p-well regions) 16.

The concentration of the n-type impurity in the n-type fourth SiC region (the current spreading layer) 70 is higher than that in the n⁻-SiC layer 14, and is approximately $1 \times 10^{18}$ to $2 \times 10^{19}$ cm$^{-3}$, for example.

As the n-type fourth SiC region (the current spreading layer) 70 is provided, the depletion layer extending from the pair of p-type first SiC region (the p-well regions) 16 to the n⁻-SiC layer 14 is restrained when the MOSFET 200 is turned on. Also, the resistance of the n⁻-SiC layer 14 is lowered. Accordingly, the so-called JFET (Junction Field Effect Transistor) is lowered, and the ON resistance is lowered.

The n⁺-type fourth SiC region (the current spreading layer) 70 is co-doped with the p-type impurity and the n-type impurity. Where the p-type impurity is the element A and the n-type impurity is the element D, the element A and the element D form a combination of Al (aluminum), Ga (gallium), or In (indium) and N (nitrogen), and/or a combination of B (boron) and P (phosphorus). The ratio of the concentration of the element A to the concentration of the element D in the combination is higher than 0.40 but lower than 0.95. The concentration of the element D forming part of the combination is not lower than $1 \times 10^{18}$ cm$^{-3}$ and not higher than $1 \times 10^{22}$ cm$^{-3}$. In the following, an example case where the element A is Al and the element D is N is described.

A gate insulating film 28 is continuously formed on the surfaces of the n⁻-SiC layer 14 and the first SiC region (the p-well region) 16, so as to bridge the space between the layer and the region. The gate insulating film 28 may be an $SiO_2$ film or a high-k insulating film, for example.

A gate electrode 30 is formed on the gate insulating film 28. The gate electrode 30 may be made of polysilicon, for example. An interlayer insulating film 32 formed with an $SiO_2$ film, for example, is formed on the gate electrode 30.

The first SiC regions 16 interposed between the second SiC regions (the source regions) 18 under the gate electrode 30 and the n⁻-SiC layer 14 functions as the channel regions of the MOSFET 200.

A conductive first electrode (a source/p-well common electrode) 24 that is electrically connected to the second SiC regions (the source regions) 18 and the third SiC regions (the p-well contact regions) 20 is then formed. The first electrode (the source/p-well common electrode) 24 is formed with a Ni (nickel) barrier metal layer 24a and an Al metal layer 24b formed on the barrier metal layer 24a, for example. The Ni barrier metal layer 24a and the Al metal layer 24b may form an alloy through a reaction.

A conductive second electrode (a drain electrode) 36 is formed on the side of the second face of the SiC substrate 12. The second electrode (the drain electrode) 36 is made of Ni, for example.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

In the MOSFET 200 of this embodiment, the n-type fourth SiC region (the current spreading layer) 70 is co-doped with a p-type impurity such as Al and an n-type impurity such as N. As a result, the sheet resistance and the resistivity of the n-type fourth SiC region (the current spreading layer) 70 are lowered. Accordingly, a reduction in the ON resistance is achieved, and the high-performance MOSFET 200 is realized.

As trimers are formed, the crystalline structures are stabilized, and crystal defects are reduced. Accordingly, the MOSFET 200 having smaller leak current is realized. Furthermore, as the crystalline structures are stabilized, the MOSFET 200 that has excellent energization breakdown tolerance is realized.

The concentration of the n-type impurity contained in the current spreading layer 70 is not lower than $1 \times 10^{18}$ cm$^{-3}$ and not higher than $1 \times 10^{22}$ cm$^{-3}$. If the concentration is lower than the range, there is a possibility that interaction between the p-type impurity and the n-type impurity does not occur, and trimers are not formed, particularly when co-doping is performed through ion implantation. This is also because it is difficult to solve the n-type impurity having a concentration higher than the range.

In a case where the p-type impurity is the element A and the n-type impurity is the element D in the current spreading layer 70, the ratio of the concentration of the element A to the concentration of the element D is higher than 0.40 but lower than 0.95, so as to sufficiently lower the sheet resistance or the resistivity of the current spreading layer 70, and lower the ON resistance. Also, the ratio of the concentration of the element A to the concentration of the element D is preferably not lower than 0.45 and not higher than 0.75. More preferably, the ratio is not lower than 0.47 and not higher than 0.60.

The ratio of the concentration of the element A to the concentration of the element D can be calculated by determining the respective densities of the element A and the element D by SIMS (Secondary Ion Microprobe Spectrometry), for example.

In a case where the p-type impurity is the element A and the n-type impurity is the element D in the current spreading layer 70, the donor levels that contribute to generation of carriers of the element D is preferably 40 meV or less, so as to reduce the sheet resistance or the resistivity. More preferably, the donor levels are 35 meV or less. Even more preferably, the donor levels are 20 meV or less.

The donor levels of the element D can be determined by measuring the activation energy of the sheet resistance or the resistivity of the current spreading layer 70, for example.

So as to sufficiently lower the sheet resistance or the resistivity of the current spreading layer 70 to realize a lower ON resistance, most of the p-type impurity and the n-type impurity preferably forms trimers. Therefore, 90% or more of the element A is preferably in the lattice site locations nearest to the element D. If 90% or more of the element A is in the lattice site locations nearest to the element D, most of the p-type impurity and the n-type impurity (90% or more of the part that can form trimers) can be considered to form trimers.

The proportion of the element A in the lattice site locations nearest to the element D can be determined by analyzing the binding state between the element A and the element D by XPS (X-ray Photoelectron Spectroscopy), for example.

Next, a method of manufacturing the semiconductor device of this embodiment is described.

Figure 18:
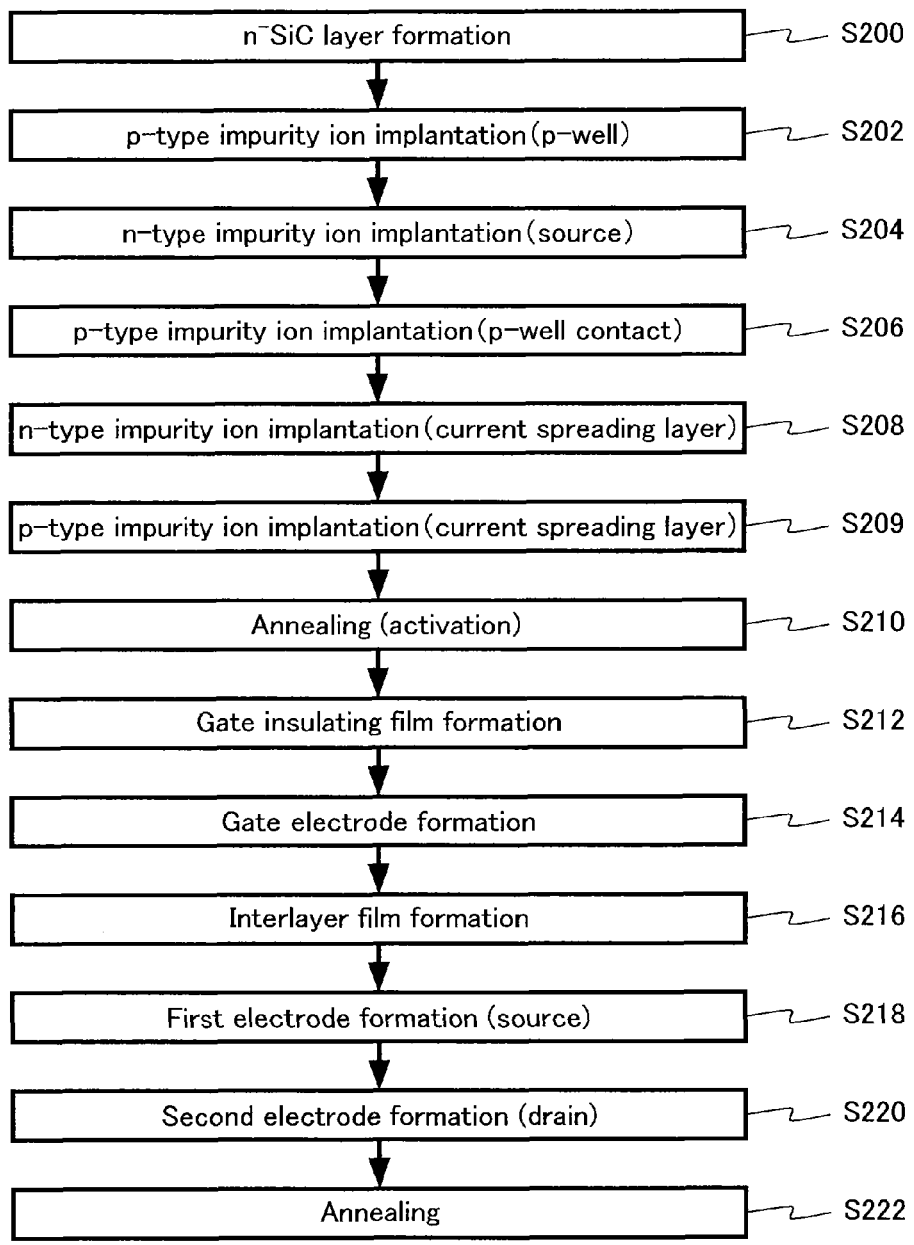
FIG. 18 is a process flowchart showing a method of manufacturing the semiconductor device of the third embodiment.

FIG. 18 is a process flowchart showing an example of the method of manufacturing the semiconductor device of this embodiment. FIGS. 19 through 24 are schematic cross-sectional views illustrating the method of manufacturing the semiconductor device of this embodiment.

As shown in FIG. 18, the method of manufacturing the semiconductor device includes n⁻-SiC layer formation (step S200), p-type impurity ion implantation (step S202), n-type impurity ion implantation (step S204), p-type impurity ion implantation (step S206), n-type impurity ion implantation (step S208), p-type impurity ion implantation (step S209), annealing (step S210), gate insulating film formation (step S212), gate electrode formation (step S214), interlayer film formation (step S216), first electrode formation (step S218), second electrode formation (step S220), and annealing (step S222).

First, the n-type SiC substrate 12 that contains P (phosphorus) or N (nitrogen) as the n-type impurity at an impurity concentration of approximately $5\times10^{18}$ cm$^{-3}$, has a thickness of 300 μm, for example, and has a low resistance of 4H—SiC, is prepared.

In step S200, the high-resistance n$^-$-SiC layer 14 that contains N as the n-type impurity at an impurity concentration of approximately $1\times10^{16}$=$^{-3}$, for example, and has a thickness of approximately 10 μm is epitaxially grown on one of the faces of the SiC substrate 12 by an epitaxial growth technique.

Figure 19:
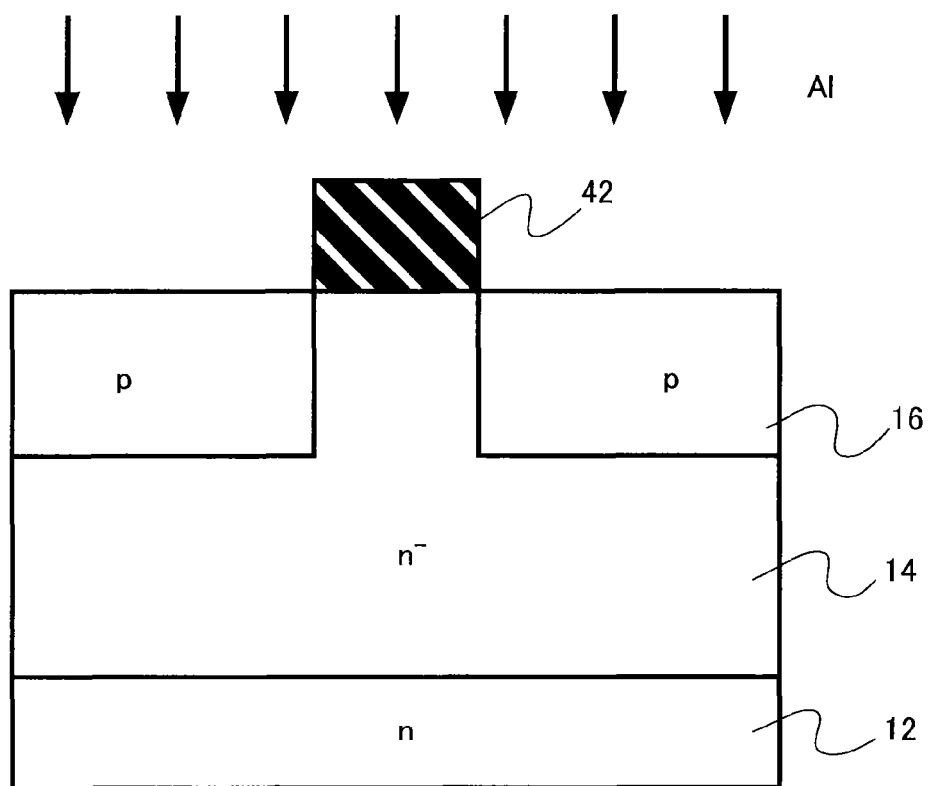
FIG. 19 is a schematic cross-sectional view illustrating the method of manufacturing the semiconductor device of the third embodiment.

After that, patterning is performed by photolithography and etching, to form a first mask material 42 that is made of SiO$_2$, for example. In step S202, Al as the p-type impurity is implanted into the n$^-$-SiC layer 14 through ion implantation by using the first mask material 42 as an ion implantation mask, to form the pair of first SiC regions (the p-well regions) 16 (FIG. 19).

Figure 20:
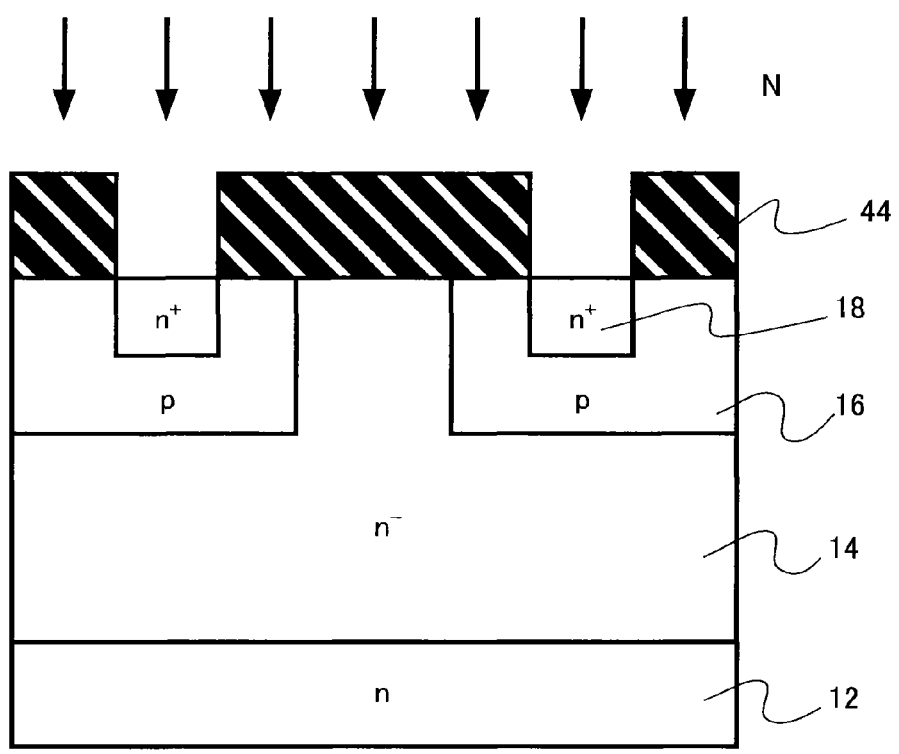
FIG. 20 is a schematic cross-sectional view illustrating the method of manufacturing the semiconductor device of the third embodiment.

After that, patterning is performed by photolithography and etching, to form a second mask material 44 that is made of SiO$_2$, for example. In step S204, N as the n-type impurity is implanted into the n$^-$-SiC layer 14 through ion implantation by using the second mask material 44 as an ion implantation mask, to form the pair of second SiC regions (the source regions) 18 (FIG. 20).

Figure 21:
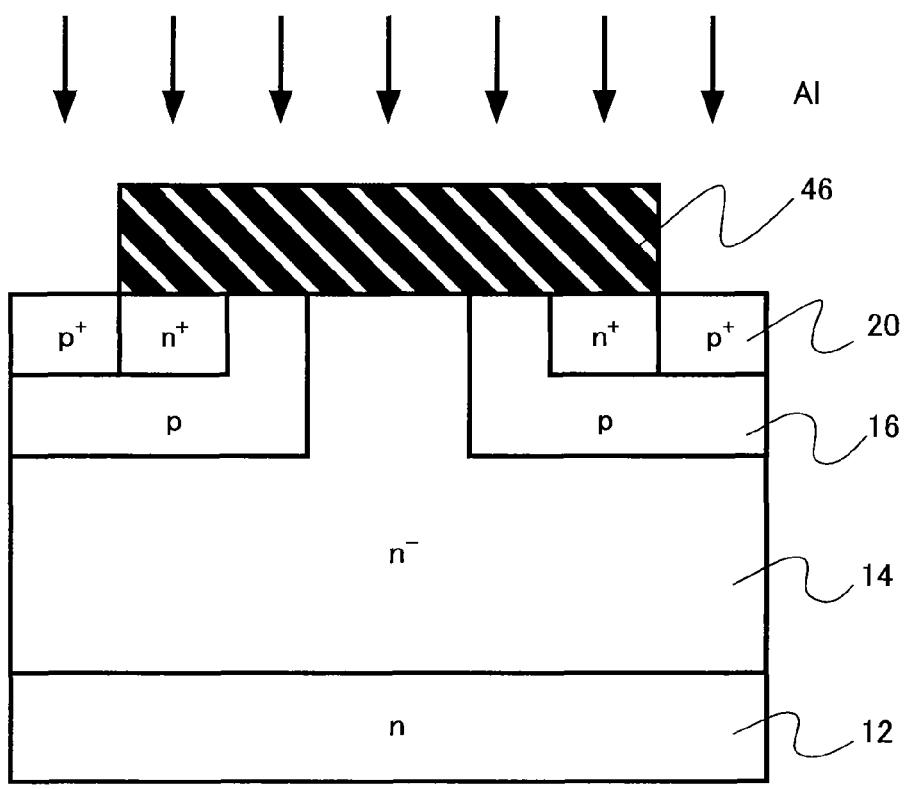
FIG. 21 is a schematic cross-sectional view illustrating the method of manufacturing the semiconductor device of the third embodiment.

After that, patterning is performed by photolithography and etching, to form a third mask material 46 that is made of SiO$_2$, for example. In step S206, Al as the p-type impurity is implanted into the n$^-$-SiC layer 14 through ion implantation by using the third mask material 46 as an ion implantation mask, to form the pair of third SiC regions (the p-well contact regions) 20 (FIG. 21).

Figure 22:
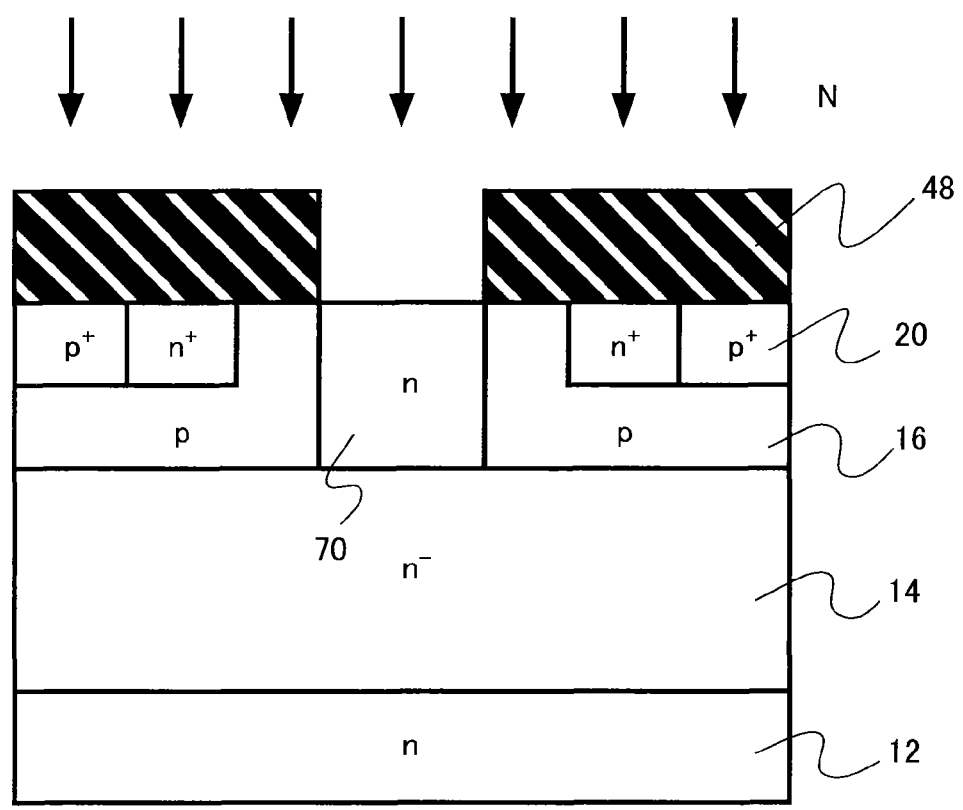
FIG. 22 is a schematic cross-sectional view illustrating the method of manufacturing the semiconductor device of the third embodiment.

After that, patterning is performed by photolithography and etching, to form a fourth mask material 48 that is made of SiO$_2$, for example. In step S208, N as the n-type impurity is implanted into the n$^-$-SiC layer 14 through ion implantation by using the fourth mask material 48 as an ion implantation mask, to form the n-type fourth SiC region (the current spreading layer) 70 between the two first SiC regions (the p-well regions) 16 (FIG. 22).

Figure 23:
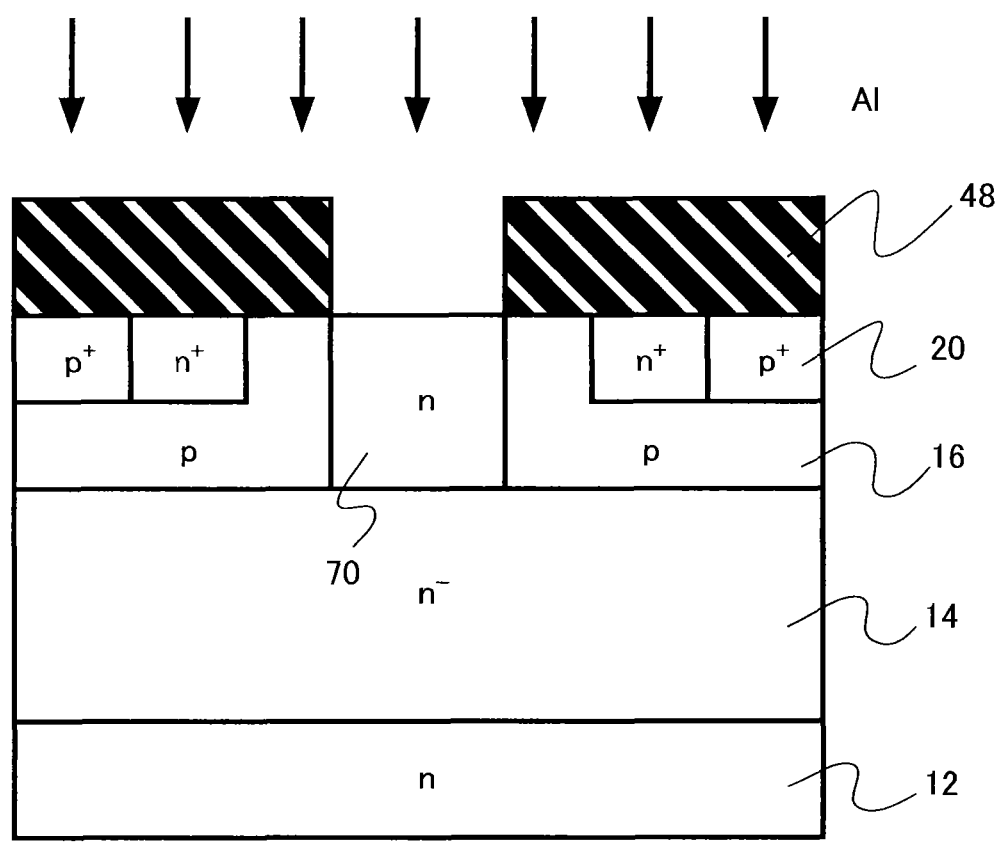
FIG. 23 is a schematic cross-sectional view illustrating the method of manufacturing the semiconductor device of the third embodiment.

Further, in step S209, Al as the p-type impurity is implanted into the fourth SiC region (the current spreading layer) 70 through ion implantation by using the same fourth mask material 48 as an ion implantation mask (FIG. 23).

As described above, in steps S208 and S209, co-doping is performed through ion implantation of the p-type impurity and the n-type impurity, to form the fourth SiC region (the current spreading layer) 70. Although the p-type impurity is Al and the n-type impurity is N in this example, the element A and the element D form a combination of Al (aluminum), Ga (gallium), or In (indium) and N (nitrogen), and/or a combination of B (boron) and P (phosphorus) in a case where the p-type impurity is the element A and the n-type impurity is the element D.

So as to form trimers through interaction between the p-type impurity and the n-type impurity in the current spreading layer 70, the distribution of the p-type impurity and the distribution of the n-type impurity are preferably the same after the ion implantation.

Therefore, the ratio of the projected range (Rp) at the time of ion implantation of the p-type impurity to the projected range (Rp) at the time of ion implantation of the n-type impurity is set within the range of 90% to 110%. More preferably, the ratio is in the range of 95% to 105%.

The diffusion length of an impurity in SiC is shorter than that in Si. Therefore, the projected ranges of the p-type impurity and the n-type impurity may be made to differ from each other, and the current spreading layer 70 may be formed by performing ion implantation in stages divided in accordance with the projected ranges (Rp). In this manner, the current spreading layer 70 having a more uniform concentration in the depth direction can be formed.

So as to lower the sheet resistance or the resistivity of the current spreading layer 70, the ratio of the dose amount of Al as the p-type impurity to the dose amount of N as the n-type impurity is higher than 0.40 but lower than 0.95.

Also, so as to lower the sheet resistance or the resistivity of the current spreading layer 70 through interaction between the p-type impurity and the n-type impurity, the dose amounts at the time of ion implantation are controlled so that the concentration of N as the n-type impurity becomes not lower than $1\times10^{18}$ cm$^{-3}$ and not higher than $1\times10^{22}$ cm$^{-3}$.

In step S210, after the current spreading layer 70 is formed by performing co-doping through ion implantation of the p-type impurity and the n-type impurity, annealing for activation is performed. The conditions for the annealing are that an argon (Ar) gas is used as an atmosphere gas, the heating temperature is 1600° C., and the heating period is 30 minutes, for example. At this point, the impurities implanted into the SiC can be activated, but diffusion is small.

Figure 24:
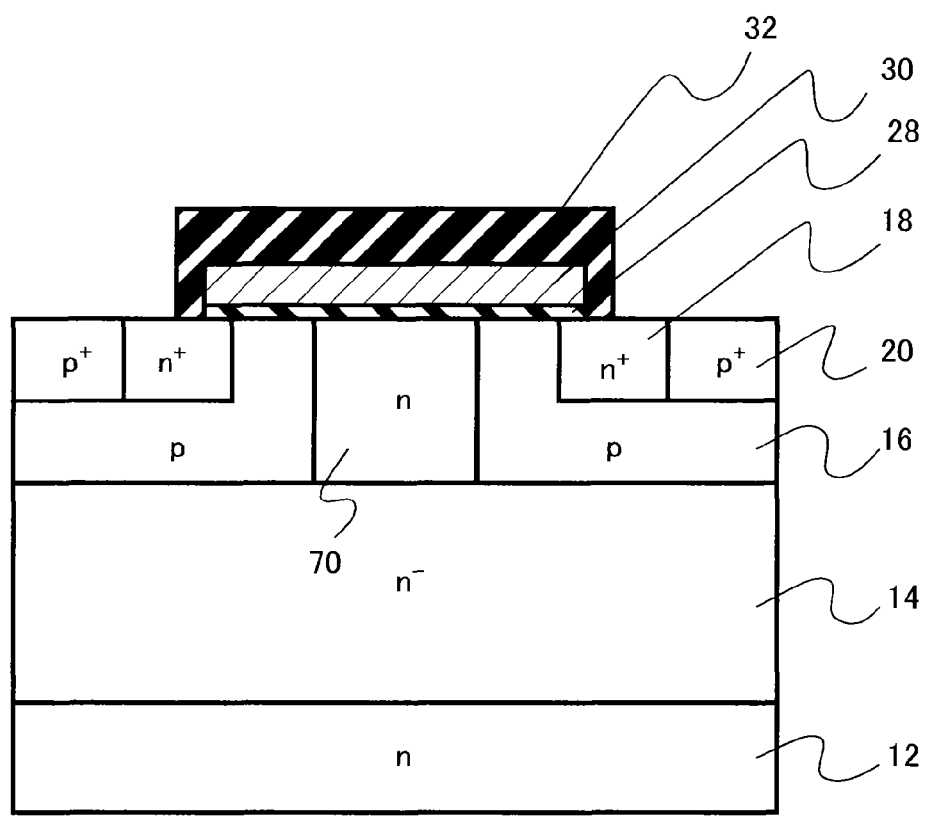
FIG. 24 is a schematic cross-sectional view illustrating the method of manufacturing the semiconductor device of the third embodiment.

In step S212, the gate insulating film 28 that is formed with an SiO$_2$ film, for example, is formed by CVD (Chemical Vapor Deposition) or thermal oxidation. In step S214, the gate electrode 30 that is made of polysilicon, for example, is formed on the gate insulating film 28. In step S216, the interlayer insulating film 32 that is formed with an SiO$_2$ film, for example, is formed on the gate electrode 30 (FIG. 24).

In step S218, the conductive first electrode (the source/p-well common electrode) 24 that is electrically connected to the second SiC regions (the source regions) 18 and the third SiC regions (the p-well contact regions) 20 is formed. The first electrode (the source/p-well common electrode) 24 is formed by Ni (nickel) and Al sputtering, for example.

In step S220, the conductive second electrode (the drain electrode) 36 is formed on the side of the second face of the n$^-$SiC substrate 12. The second electrode (the drain electrode) 36 is formed by Ni sputtering, for example.

In step S222, annealing at a low temperature is performed to lower the contact resistance between the first electrode 24 and the second electrode 36. The annealing is performed in an argon gas atmosphere at 400° C., for example.

By the above described manufacturing method, the MOSFET 200 shown in FIG. 17 is formed.

According to the manufacturing method in this embodiment, the n-type current spreading layer 70 is co-doped with a p-type impurity such as Al and an n-type impurity such as N. Accordingly, the sheet resistance or the resistivity of the current spreading layer 70 is lowered. Accordingly, the ON resistance is lowered, and the high-performance MOSFET 200 can be manufactured.

Also, the respective impurities can easily enter lattice points by virtue of the co-doping with the p-type impurity and the n-impurity. Accordingly, the temperature of the activating anneal in step S210 can be made lower than that in a case where co-doping is not performed.

Further, the crystalline structures are stabilized by the formation of trimers or pair structures, and characteristics degradation due to expansion of crystal defects formed at the time of ion implantation into SiC can be restrained.

The current spreading layer 70 may be formed in part of the region located between the two first SiC regions (the p-well regions) 16.

For example, the current spreading layer 70 may be formed only at side face portions of the two first SiC regions (the p-well regions) 16 may be formed through angled ion implantation or the like. In such a structure, the depletion layer can be restrained, and the JFET resistance can be lowered.

For example, a portion of the SiC layer 14 not having the current spreading layer 70 formed therein may exist between the current spreading layer 70 and the gate insulating film 28. Alternatively, a p-type region may be provided between the current spreading layer 70 and the gate insulating film 28. With this arrangement, the withstand voltage of the gate insulating film 28 is maintained. This p-type region is preferably formed by using the same mask as that used for forming the current spreading layer 70 and by performing the co-doping of this embodiment so that the ratio between the impurities is reversed from that in the current spreading layer 70. For example, if the current spreading layer 70 is formed at the ratio Al:N=1:2, and a p-type layer at Al:N=2:1 is formed thereon, charge response in the p-type region becomes faster, and accordingly, switching response becomes faster.

Also, the pattern of the second mask material 44 may be changed so that the current spreading layer 70 and the second SiC regions (the source regions) 18 can be formed at the same time.

Fourth Embodiment

A semiconductor device of this embodiment is the same as that of the first embodiment, except for being an IGBT (Insulated Gate Bipolar Transistor) having a p-type SiC substrate, instead of an n-type SiC substrate. Therefore, the same explanations as those in the first embodiment will not be repeated.

Figure 25:
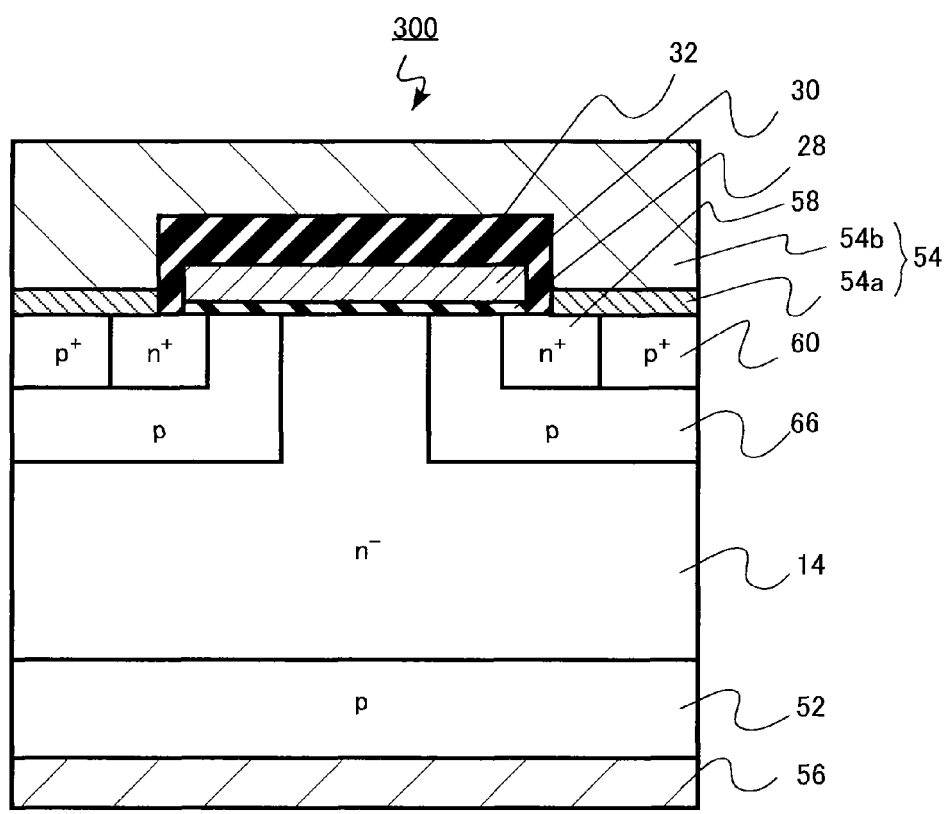
FIG. 25 is a schematic cross-sectional view of a semiconductor device of a fourth embodiment.

FIG. 25 is a schematic cross-sectional view of the structure of an IGBT (Insulated Gate Bipolar Transistor) that is a semiconductor device of this embodiment.

This IGBT 300 includes a p-type SiC substrate (a silicon carbide substrate) 52 having first and second faces. In FIG. 25, the first face is the upper face, and the second face is the lower face. This SiC substrate 52 is a 4H—SiC substrate (a p-substrate) that contains Al (aluminum) as an n-type impurity at an impurity concentration of approximately $1 \times 10^{18}$ to $1 \times 10^{19}$ cm$^{-3}$, for example.

An n-type SiC layer (an n$^-$-SiC layer) 14 containing an n-type impurity at an impurity concentration of approximately $5 \times 10^{15}$ to $2 \times 10^{16}$ cm$^{-3}$ is formed on the first face of the SiC substrate 52. The film thickness of the n$^-$-SiC layer 14 is approximately 5 to 10 μm, for example.

A p-type first SiC region (a first emitter region) 66 containing the p-type impurity at an impurity concentration of approximately $5 \times 10^{15}$ to $1 \times 10^{17}$ cm$^{-3}$ is formed in part of the surface of the n$^-$-SiC layer 14. The depth of the first emitter region 66 is approximately 0.6 μm, for example.

An n$^+$-type second SiC region (a second emitter region) 58 containing the n-type impurity at an impurity concentration of approximately $5 \times 10^{19}$ to $1 \times 10^{22}$ cm$^{-3}$ is formed in part of the surface of the first SiC region (the first emitter region) 66. The depth of the second emitter region 58 is smaller than the depth of the first SiC region (the first emitter region) 66, and is approximately 0.3 μm, for example.

The n$^+$-type second SiC region (the second emitter region) 58 is co-doped with the p-type impurity and the n-type impurity. Where the p-type impurity is an element A and the n-type impurity is an element D, the element A and the element D form a combination of Al (aluminum), Ga (gallium), or In (indium) and N (nitrogen), and/or a combination of B (boron) and P (phosphorus). The ratio of the concentration of the element A to the concentration of the element D in the combination is higher than 0.40 but lower than 0.95. The concentration of the element D forming part of the combination is not lower than $1 \times 10^{18}$ cm$^{-3}$ and not higher than $1 \times 10^{22}$ cm$^{-3}$. In the following, an example case where the element A is Al and the element D is N is described.

A p$^+$-type third SiC region (an emitter contact region) 60 containing the p-type impurity at an impurity concentration of approximately $5 \times 10^{19}$ to $1 \times 10^{22}$ cm$^{-3}$ is formed in part of the surface of the first SiC region (the first emitter region) 66 and on a side of the n$^+$-type second SiC region (the second emitter region) 58. The depth of the emitter contact region 60 is smaller than the depth of the first SiC region (the first emitter region) 66, and is approximately 0.3 μm, for example.

Further, a gate insulating film 28 is continuously formed on the surfaces of the SiC layer (the n$^-$-layer) 14 and the first SiC region (the first emitter region) 66, so as to bridge the space between the layer and the region. The gate insulating film 28 may be an SiO$_2$ film or a high-k insulating film, for example.

A gate electrode 30 is formed on the gate insulating film 28. The gate insulating film 28 may be an SiO$_2$ film, for example. The gate electrode 30 may be made of polysilicon, for example. An interlayer insulating film 32 formed with an SiO$_2$ film, for example, is formed on the gate electrode 30.

The first SiC region 66 that is located below the gate electrode 30 and is interposed between the second SiC region (the second emitter region) 58 and the SiC layer (the n$^-$-layer) 14 serves as the channel region.

A conductive first electrode (an emitter electrode) 54 that is electrically connected to the second SiC region (the second emitter region) 58 and the third SiC region (the emitter contact region) 60 is provided. The first electrode (the emitter electrode) 54 is formed with a Ni (nickel) barrier metal layer 54a and an Al metal layer 54b formed on the barrier metal layer 54a, for example. The Ni barrier metal layer 54a and the Al metal layer 54b may form an alloy through a reaction.

A conductive second electrode (a collector electrode) 56 is formed on the side of the second face of the SiC substrate 12 and on the bottom face of the p-type SiC substrate 52. The second electrode (the collector electrode) 56 is made of Ni, for example.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

In the IGBT 300 of this embodiment, the second SiC region (the second emitter region) 58 is co-doped with a p-type impurity such as Al and an n-type impurity such as N. As a result, the sheet resistance or the resistivity of the second SiC region (the second emitter region) 58 is lowered. Also, the contact resistance between the second SiC region (the second emitter region) 58 and the first electrode (the emitter electrode) 54 is lowered. Accordingly, the IGBT 300 having a large ON current is realized.

Since the energy levels of dopant are shallow in this embodiment, carriers are generated and annihilated at high speed. As a result, the time required for switching on and the time required for switching off can be made half or shorter than that required in an IGBT in which co-doping is not performed. If the range of co-doping is widened, a higher speed can be achieved, and the problem of low-speed operation that is a drawback of a bipolar device can be eliminated.

When the range of co-doping is widened, co-doping may be performed in the channel region (the first emitter region), for example. If implantation of dopant at approximately $1\times10^{18}$ cm$^{-3}$ is allowed depending on device characteristics such as the threshold value, co-doping can be performed in the channel region. Further, co-doping may be performed in the channel region, the drift layer, and the like by an epitaxial growth technique. If co-doping is performed on the largest possible amount of the charge entrance and exit portion in the structure forming the bipolar device, even faster operation can be performed.

As trimers are formed, the crystalline structures are stabilized, and crystal defects are decreased. Accordingly, the IGBT 300 having smaller leak current at the time of reverse bias application is realized. Furthermore, as the crystalline structures are stabilized, the IGBT 300 that has excellent energization breakdown tolerance is realized.

As described above, the structure of the IGBT 300 of this embodiment differs from the structure of the MOSFET 100 of the first embodiment only in that the n-substrate 12 is replaced with the p-substrate 52. Accordingly, the IGBT 300 can be manufactured by a method that is the same as the manufacturing method of the first embodiment, except that the SiC layer 14 is formed on the p-substrate 52. Also, the aspects of the second or third embodiments may be added.

If the current spreading layer 70 described in the third embodiment is incorporated into the IGBT 300, an IGBT 300 with a larger ON current is realized. Since the energy levels of the dopant are shallow, charge generation and annihilation become faster. As a result, switching becomes even faster.

Fifth Embodiment

A semiconductor material of this embodiment is an n-type semiconductor material that contains a p-type impurity and an n-type impurity in SiC. Where the p-type impurity is an element A and the n-type impurity is an element D, the element A and the element D form a combination of Al (aluminum), Ga (gallium), or In (indium) and N (nitrogen), and/or a combination of B (boron) and P (phosphorus). The ratio of the concentration of the element A to the concentration of the element D in the combination is higher than 0.40 but lower than 0.95.

The semiconductor material of this embodiment is an ingot of SiC or a wafer of SiC, for example. In the semiconductor material of this embodiment, SiC is co-doped with a predetermined p-type impurity and a predetermined n-type impurity at a predetermined ratio. With this structure, an n-type SiC semiconductor material with a low resistance and a low defect concentration can be realized by the function described in detail in the first embodiment.

The concentration of the n-type impurity contained in the n-type SiC semiconductor material is preferably not lower than $1\times10^{18}$ cm$^{-3}$ and not higher than $1\times10^{22}$ cm$^{-3}$. If the concentration is lower than the range, there is a possibility that interaction between the p-type impurity and the n-type impurity does not occur, and trimers are not formed, particularly when co-doping is performed through ion implantation. This is also because it is difficult to solve the n-type impurity having a concentration higher than the range.

In a case where the p-type impurity is the element A and the n-type impurity is the element D in the n-type SiC semiconductor material, the ratio of the concentration of the element A to the concentration of the element D is higher than 0.40 but lower than 0.95, so as to sufficiently lower the sheet resistance or the resistivity of the n-type SiC semiconductor material. Also, the ratio of the concentration of the element D to the concentration of the element A is preferably not lower than 0.45 and not higher than 0.75. More preferably, the ratio is not lower than 0.47 and not higher than 0.60.

In a case where the p-type impurity is the element A and the n-type impurity is the element D in the n-type SiC semiconductor material, the donor levels of the element D is preferably 40 meV or less, so as to achieve the effects of co-doping. More preferably, the donor levels are 35 meV or less. Even more preferably, the donor levels are 20 meV or less.

So as to lower the sheet resistance or the resistivity of the n-type SiC semiconductor material, most of the p-type impurity and the n-type impurity preferably forms trimers. Therefore, 90% or more of the element A is preferably in the lattice site locations nearest to the element D. If 90% or more of the element A is in the lattice site locations nearest to the element D, most of the p-type impurity and the n-type impurity (90% or more of the part that can form trimers) can be considered to form trimers.

Although silicon carbide crystalline structures are 4H—SiC in the above described embodiments, the embodiments can also be applied to silicon carbides having other crystalline structures such as 6H—SiC and 3C—SiC.

Also, in the above described embodiments, the combination of a p-type impurity and an n-type impurity is a combination of Al (aluminum) and N (nitrogen). However, the combination is not limited to that, and the same effects as above can be achieved, as long as the combination is either a combination of Al (aluminum), Ga (gallium), or In (indium) and N (nitrogen), or a combination of B (boron) and P (phosphorus).

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising
an n-type SiC region containing a p-type impurity and an n-type impurity,
wherein,
the p-type impurity being an element A and the n-type impurity being an element D, the element A and the element D form at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus),
a ratio of a concentration of the element A to a concentration of the element D forming at least one of the combinations is higher than 0.40 and lower than 0.95, and
the concentration of the element D forming at least one of the combinations is not lower than $1\times10^{18}$ cm$^{-3}$ and not higher than $1\times10^{22}$ cm$^{-3}$.

2. The device according to claim 1, wherein the ratio of the concentration of the element A to the concentration of the element D is not lower than 0.45 and not higher than 0.75.

3. The device according to claim 1, wherein a donor level of the element D is 40 meV or less.

4. The device according to claim 1, wherein 90% or more of the element A is in a lattice site location nearest to the element D.

5. A semiconductor device comprising:
an SiC substrate having first and second faces;
an n-type SiC layer formed on a side of the first face of the SiC substrate;
a p-type first SiC region formed in a surface of the SiC layer;
an n-type second SiC region formed in a surface of the first SiC region, the second SiC region containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element A to a concentration of the element D forming at least one of the combinations being higher than 0.40 and lower than 0.95, the concentration of the element D forming at least one of the combinations being not lower than $1\times10^{18}$ cm$^{-3}$ and not higher than $1\times10^{22}$ cm$^{-3}$;
a gate insulating film formed continuously on the surface of the SiC layer and the surface of the first SiC region;
a gate electrode formed on the gate insulating film;
a first electrode formed on the second SiC region; and
a second electrode formed on a side of the second face of the SiC substrate.

6. The device according to claim 5, wherein the ratio of the concentration of the element A to the concentration of the element D is not lower than 0.45 and not higher than 0.75.

7. The device according to claim 5, wherein a donor level of the element D is 40 meV or less.

8. The device according to claim 5, wherein 90% or more of the element A is in a lattice site location nearest to the element D.

9. A semiconductor device comprising:
an SiC substrate having first and second faces;
an n-type SiC layer formed on a side of the first face of the SiC substrate;
a pair of p-type first SiC regions formed in a surface of the SiC layer;
a pair of n-type second SiC regions formed in surfaces of the first SiC regions;
an n-type third SiC region formed in a portion of the SiC layer, the portion being located between the pair of p-type first SiC regions, the third SiC region containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element A to a concentration of the element D forming at least one of the combinations being higher than 0.40 and lower than 0.95, the concentration of the element D forming at least one of the combinations being not lower than $1\times10^{18}$ cm$^{-3}$ and not higher than $1\times10^{22}$ cm$^{-3}$, the third SiC region having a higher n-type impurity concentration than an n-type impurity concentration in the SiC layer;
a gate insulating film formed continuously on the surface of the SiC layer and the surfaces of the first SiC regions;
a gate electrode formed on the gate insulating film;
a first electrode formed on the second SiC regions; and
a second electrode formed on a side of the second face of the SiC substrate.

10. The device according to claim 9, wherein the ratio of the concentration of the element A to the concentration of the element D is not lower than 0.45 and not higher than 0.75.

11. The device according to claim 9, wherein a donor level of the element D is 40 meV or less.

12. The device according to claim 9, wherein 90% or more of the element A is in a lattice site location nearest to the element D.

13. A method of manufacturing a semiconductor device, comprising
forming an n-type SiC region by implanting a p-type impurity and an n-type impurity into SiC by ion implantation,
wherein, the p-type impurity being an element A and the n-type impurity being an element D, the element A and the element D form at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), and a ratio of a concentration of the element A to a concentration of the element D forming at least one of the combinations is higher than 0.40 and lower than 0.95,
a ratio of a projected range (Rp) in ion implantation of the p-type impurity to a projected range (Rp) in ion implantation of the n-type impurity is not lower than 90% and not higher than 110%, and
the concentration of the element D forming at least one of the combinations in the n-type SiC region is not lower than $1\times10^{18}$ cm$^{-3}$ and not higher than $1\times10^{22}$ cm$^{-3}$.

14. The method according to claim 13, wherein the ratio of a dose amount of the element A to a dose amount of the element D is not lower than 0.45 and not higher than 0.75.

15. The method according to claim 13, wherein the ion implantation of the p-type impurity and the n-type impurity is performed in a plurality of stages divided in accordance with a plurality of projected ranges (Rp).

* * * * *